(12) United States Patent
Qin

(10) Patent No.: US 11,416,739 B2
(45) Date of Patent: Aug. 16, 2022

(54) OPTIMIZATION CONTROL TECHNOLOGY FOR BUILDING ENERGY CONSERVATION

(71) Applicant: Lawrence Livermore National Security, LLC, Livermore, CA (US)

(72) Inventor: Yining Qin, Brentwood, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1226 days.

(21) Appl. No.: 15/882,527

(22) Filed: Jan. 29, 2018

(65) Prior Publication Data

US 2019/0236446 A1 Aug. 1, 2019

(51) Int. Cl.
| | |
|---|---|
| *G06N 3/08* | (2006.01) |
| *G06N 3/04* | (2006.01) |
| *G06N 3/10* | (2006.01) |
| *G06F 30/17* | (2020.01) |

(52) U.S. Cl.
CPC ............... *G06N 3/08* (2013.01); *G06F 30/17* (2020.01); *G06N 3/04* (2013.01); *G06N 3/10* (2013.01)

(58) Field of Classification Search
CPC ............... G06N 3/08; G06N 3/04; G06N 3/10
See application file for complete search history.

(56) References Cited

U.S. PATENT DOCUMENTS

| | | | | |
|---|---|---|---|---|
| 9,754,221 B1* | 9/2017 | Nagaraja | ................... | G06N 3/08 |
| 2005/0075846 A1* | 4/2005 | Kim | ..................... | G01N 29/245 703/1 |
| 2011/0231320 A1* | 9/2011 | Irving | ................... | G06Q 30/00 705/80 |
| 2015/0110597 A1* | 4/2015 | Dull | ...................... | F04D 27/001 415/1 |

OTHER PUBLICATIONS

Sholahudin, S., & Han, H. (2016). Simplified dynamic neural network model to predict heating load of a building using Taguchi method. Energy, 115, 1672-1678. (Year: 2016).*

Peng, X. B., Berseth, G., Yin, K., & Van De Panne, M. (2017). Deeploco: Dynamic locomotion skills using hierarchical deep reinforcement learning. ACM Transactions on Graphics (TOG), 36(4), 1-13. (Year: 2017).*

* cited by examiner

*Primary Examiner* — Kamran Afshar
*Assistant Examiner* — Lokesha G Patel
(74) *Attorney, Agent, or Firm* — Harness, Dickey & Pierce, P.L.C.

(57) ABSTRACT

A simulation processor generates and stores a simulation model based on conditions associated with a physical structure, such as a building. A neural network processor implements a neural network, having an input layer coupled to receive sensor data from the structure and having an output layer coupled to supply control signals to the at least one electrically operable environmental control device. The neural network is trained using the simulation model. A particle swarm optimization processor programmed to receive the simulation results and perform particle swarm optimization, ascertains optimal parameters for controlling the at least one electrically operable environmental control device and supplies these optimal parameters to the neural network processor. The neural network processor uses the optimal parameters supplied by the particle swarm optimization processor to further train the neural network.

9 Claims, 22 Drawing Sheets

OPTIMIZATION CONTROL TECHNOLOGY FOR BUILDING ENERGY CONSERVATION

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates generally to control systems for energy usage within buildings. More particularly the disclosure relates to a computer or processor implemented control system to perform energy audit and system optimization using a model-based learning system that is optimized by a population based stochastic optimization algorithm such as particle swarm optimization.

BACKGROUND

Commercial buildings represent one of the largest energy consumption sectors within the United States. Commercial Buildings. In 2015, for example, commercial buildings contributed 40% domestic electricity use, 40% natural gas consumption, 1.5 billion metric ton $CO_2$ emission at a total cost of more than 400 billion dollars. One reason for this is that today's modern structures include a number of energy consuming systems, such as hot water for sanitary uses, ventilation and air conditioning, lighting, electrical auxiliary equipment, and heating.

To save energy and reduce $CO_2$ emissions, it would be desirable if all commercial buildings and other energy consuming structures were always operated at optimal efficiency. Such goal has heretofore been extremely difficult to attain because even well-designed structures will tend to drift away from optimal efficiency as equipment ages and as the structure occupants change thermostat settings. In addition, even when all equipment is in good operating order and all thermostats have been set properly, other external factors can degrade optimal energy efficiency. Such external factors include changes in weather conditions and changes in occupant behavior patterns.

SUMMARY

This section provides a general summary of the disclosure, and is not a comprehensive disclosure of its full scope or all of its features.

The disclosed optimization control system and method addresses the energy efficiency and emissions issues that plague conventional commercial buildings and other structures. The disclosed optimization control system and method employs two states, an energy audit stage and an optimization stage. In this disclosure the optimization control system is also referred to as the artificial intelligence control system (AICS).

The energy audit stage performs a zero-touch, objectively autonomous process that monitors and assesses energy losses and energy utilization efficiency without requiring an engineer to visit the structure being audited and optimized. To do this a plurality of sensors are deployed within or in proximity to the structure. These sensors are equipped with communication links and report collected data to an audit computer that is programmed to perform a set of audit functions on the collected data and thereby compute both real time energy utilization statistics and aggregated historical statistics. The details of the set of audit functions are discussed below.

The optimization stage is performed by an optimization computer, which may be physically implemented by the same computer that serves as the audit computer, or it may be physically implemented by a separate computer coupled by hardwired connection or by network connection to the audit computer. In a networked configuration the audit computer and optimization computer can be connected via local area network or via a wide area network such as one coupled to the Internet. The optimization computer implements an artificial intelligence algorithm to determine how the energy efficiency and performance of the structure may be improved. In one embodiment the results of the optimization algorithm are used to generate electronic control instructions that are communicated to actuators disposed on or in the structure, causing the monitored energy consuming devices associated with that structure to adjust their settings and thereby improve the energy efficiency of the structure. As will be explained more fully below, the artificial intelligence algorithm comprises a learning-based model, such as a neural network model or set of models. The models are populated with data obtained from the structure, preferably as part of the audit stage, and these data define a nonlinear problem, which in the preferred embodiment, the optimization computer solves using a particle swarm optimizer.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The disclosed energy audit and optimization control technology employs sophisticated artificial intelligence computer models and analysis processes to assess and optimize the energy utilization efficiency of an energy consuming structure, such as a building having a heating ventilation and air conditioning (HVAC) system (HVAC) and optionally other electrically controlled occupant life support and convenience systems, including lighting systems. For purposes of illustration here, the optimization control technology is disclosed in a commercial building application. It will be appreciated that the disclosed technology is equally applicable to residential buildings, office buildings, campuses of integrated buildings, manufacturing plants, data centers, shopping malls, scientific research structures, including those deployed in undersea or space applications, vehicles and the like. Thus for convenience the term structure is used herein to refer to any of the aforementioned energy consuming structures.

The optimization control technology of the presently preferred embodiment performs employs two stages, an energy audit stage and an optimization stage. The energy audit stage performs a zero-touch, objectively autonomous process that monitors and assesses energy losses and energy utilization efficiency without requiring an engineer to visit the structure being audited and optimized.

To do this a plurality of sensors are deployed within or in proximity to the structure. These sensors are equipped with communication links and report collected data to an audit computer that is programmed to perform a set of audit functions on the collected data and thereby compute both real time energy utilization statistics and aggregated historical statistics. The details of the set of audit functions are discussed below.

Exemplary Structure—a Commercial Building

Figure 1:
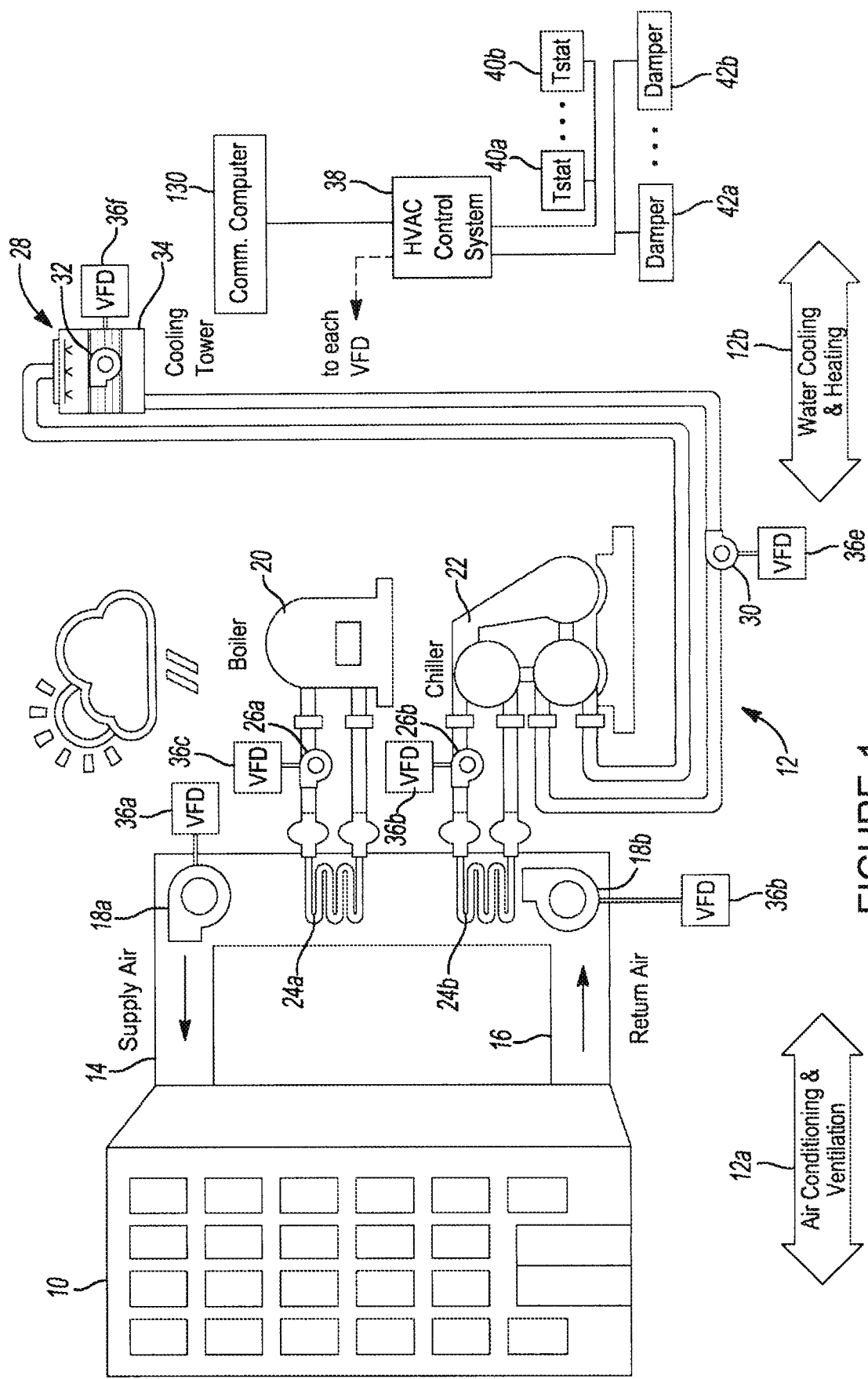
FIG. 1 is a block diagram of an exemplary structure, such as a commercial building, having energy consuming devices associated with the structure and illustrating how the optimization control system may be interfaced with the structure.

Referring to FIG. 1, an exemplary structure 10, namely a commercial building, has been illustrated. This exemplary structure will be used to explain some of the principles of the disclosed energy audit and optimization system. It will be understood that a commercial building has been selected for the example because of its familiarity to most readers. Those of skill in the art will appreciate that the principles of the disclosed energy audit and optimization system are applicable to a wide variety of other energy consuming structures.

Illustrated in FIG. 1 is an exemplary structure 10, which in this example represents a commercial building, together with an exemplary HVAC system shown generally at 12. While the details of the HVAC system can vary depending on the requirements, the illustrated HVAC system 12 includes an air conditioning and ventilation portion 12a and a water cooling and heating portion 12b. The air conditioning and ventilation portion 12a comprises a forced air system that provides supply air to the structure through a supply air duct 14 and that receives return air from the structure through a return air duct 16. One or more air blowers 18a and 18b, positioned as shown, cause the air to circulate from the supply air side, through the structure and thence through the return air side where the air is reconditioned before circulating back through the structure.

To provide both heating and cooling, respective boiler system 20 and chiller system 22 are provided. As illustrated, each of these includes heat exchanger coils 24a and 24b, positioned in the ductwork, intermediate between the supply air side and the return air side. Each of the boiler and chiller pump a heat transfer fluid in respective closed loop paths through the respective heat exchanger coils 24a and 24b, using suitable pumps 26a and 26b.

In the case of the boiler system 20, heat energy is introduced into the structure using a suitable heat source, such as a natural gas burner, an electrical heating element, a solar heating panel, a fusion reactor, or the like. In the case of the chiller system, heat energy is extracted from the structure using a cooling tower 28. As illustrated, water (or other heat exchange fluid) from the chiller system 22 is pumped using pump 30 to the cooling tower. The cooling tower includes heat exchanger coil or radiator that transfers heat from the water or other heat exchange fluid into the atmosphere. A cooling fan 34 increases the airflow through the radiator to increase transfer of heat energy to the atmosphere.

As illustrated, each of the various pumps and blowers can be electronically controlled using variable frequency drive (VFD) controllers 36a, 36b, 36c, 36d, 36e and 36f. These variable frequency drive controllers allow each of the pumps and blowers to be controlled not only, on and off, but also at different variable speeds according to instructions from an HVAC control system 38. The HVAC control system is suitably coupled to each of the VFD controllers and may also be coupled to one or more thermostats 40a, 40b deployed throughout the structure. The HVAC system may also be coupled to one or more electrically or pneumatically controlled dampers 42a, 42b that can be controlled between fully open and fully closed and to positions in between, to regulate the forced airflow through air duct systems within the structure.

Without the benefit of the disclosed optimization system, the HVAC system would affect control over heating and cooling by controlling whether the chiller is on or off and by manipulating the settings of various dampers, with the goal of providing a constant temperature within a particular zone controlled by a particular thermostat, such as thermostat 40a, or 40b. By way of example, in a typical HVAC control system to achieve a zone temperature of 72 degrees F., the HVAC control system might set the zone damper to a 15% open setting and command the chiller to be turned on. This might produce a supply air temperature from the chiller at 57 degrees F. at a static pressure of 350 pa, with the VFD 36a controlling the supply air being set to 95%.

When the disclosed optimization system is used to instruct the HVAC controller, a far more energy efficient control strategy becomes possible. Using energy audit and optimization techniques more fully discussed below, the same structure might be controlled to achieve a zone temperature of 72 degrees F. (the same as in the example above), where the chiller system 22 is commanded to be shut off, and the zone damper is set to 85.22% open. With the chiller off, the supply air temperature might be 64.4 degrees F. at a static pressure of 196.6 psi, with the VFD 36a being set to 74.5%.

Although the very same 72 degree zone temperature is achieved using the optimization system, far less energy is consumed, resulting in a 42% savings. How the disclosed optimization system achieves this much improved performance will now be described.

Modeling and Simulation

Figure 2:
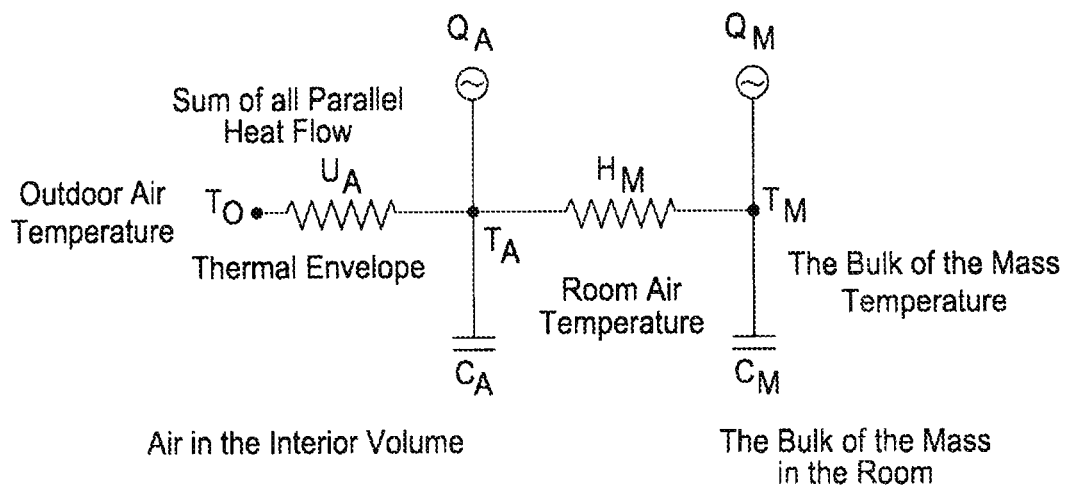
FIG. 2 is a modeling and simulation equivalent thermal parameter circuit model, useful in understanding how the neural network is trained.

The disclosed energy audit and optimization control system uses sophisticated computer models for certain aspects in both the energy audit stage and the optimization stage. By way of brief introduction, FIG. 2 illustrates how heat flow can be modeled in much the same way as electrical circuits can be modeled, where heat flow is analogous to electric current flow and temperature is analogous to voltage. As illustrated in FIG. 2, heat gains QA from solar radiation and from appliances are combined with that from the heating and cooling system to define the heat gains to the air within the structure. Each of the heat gains QM from heating and cooling, solar radiation and internal appliances define the heat gains to the bulk mass of the structure.

In FIG. 2, UA represents the thermal envelope of the structure and thus models the sum of all parallel heat flow through the thermal envelope. If an occupant opens a door, or if the seals around the windows leak, more heat flows through the thermal envelope.

In FIG. 2, CA models the interior volume of air within the structure and CM models the bulk mass of the structure. TA models the air temperature within the structure. TM models the bulk of the mass temperature of the structure. Even though the air temperature within the structure may be 72 degrees F., the temperature of the structure walls may be different-either higher or lower, depending on the season.

It will be appreciated that the model shown in FIG. 2 is intended merely to give the reader a sense of how modeling of a thermal system is performed. In the preferred embodiment, the models are far more complex than as illustrated in FIG. 2. In the preferred embodiment four different models are constructed, a thermal load model, an envelope model, an HVAC model and an occupants model. In the preferred embodiment these models are implemented using a commercially available EnergyPlus™ computer-implemented energy simulation program. For information on the EnergyPlus™ software, see energyplus.net. EnergyPlus™ is funded by the U.S. Department of Energy's (DOE) Building Technologies Office (BTO), and managed by the National Renewable Energy Laboratory (NREL).

These four models take the form depicted by the equations below.

Thermal And Envelope Model $$Q_A - U_A(T_A - T_O) - H_M(T_A - T_M) - C_A \frac{dTA}{dt} = 0 \quad (1)$$

$$Q_M - H_M(T_M - T_A) - C_M \frac{dTM}{dt} = 0 \quad (2)$$

$$a = \frac{C_M C_A}{H_M}$$

$$b = \frac{C_{M(U_A + H_M)}}{H_M} + C_A$$

$$c = U^A$$

$$d = Q^M + Q^A + U^A T_O$$

$$a\frac{d^2 T^A}{dt^2} + b\frac{dT^A}{dt} + c T^A = d \quad (3)$$

$$g = \frac{Q^M}{H^M}$$

$$A^3 = \frac{r_1 C^A}{H^M} + \frac{U^A + H^M}{H^M}$$

$$A^3 = \frac{r_2 C^A}{H^M} + \frac{U^A + H^M}{H^M}$$

$$T^A = A^1 e^{r_1 t} + A^2 e^{r_2 t} + \frac{d}{c} \quad (4)$$

$$\frac{d^{T_{Ao}}}{dt} = \frac{H^M}{C^A T_{Mo}} + \frac{U^A}{C^A T_{Ao}} + \frac{U^A}{C^A T_O} + \frac{Q^A}{C^A} \quad (5)$$

$$T^M = A^1 A^3 e^{r_1 t} + A^2 A^4 e^{r_2 t} + g + \frac{d}{c} \quad (6)$$

Where
$C_A$: air heat capacity (Btu/° F. or joules/° C.);
$C_M$: mass (of the building and its content) heat capacity (Btu/F or joules/° C.);
$U_A$: the gain/heat loss coefficient (Btu/F·hr or W/° C.) to the ambient;
$H_M$: the gain/heat loss coefficient (Btu/F·hr or W/° C.) between air and mass;
$T_O$: outdoor temperature (° F. or ° C.);
$T_A$: air temperature inside the house (° F. or ° C.);
$T_M$: mass temperature inside the house (° F. or ° C.);
$Q_A$: heat added to the indoor air;
$Q_M$: heat added to the building mass.

Plug Load Model $$P_{bui}(t) = P_{hvac}(t) + P_{plug}(t) + P_{light}(t) \quad (1)$$

$$Q_{bui}(t) = P_{bui}(t)\tan(\theta) \quad (2)$$

Where
$P_{bui}(t)$: Active power of building at t time;
$P_{hvac}(t)$: Active power of HVAC load at t time;
$P_{plug}(t)$: Active power of plug load at t time;
$P_{light}(t)$: Active power of light load at t time;
$Q_{bui}(t)$: Reactive power of building at t time;
$\tan(\theta)$: Reactive power of building at t time;

HVAC Model $$E(tf) = \int_{t0}^{tf}(-P\sup^{(t)}\eta coo + P hea^{(t)}\eta hea + P fan^{(t)})dt$$

$$Er(tf) = \int_{t0}^{tf}(-r^1 P\sup(t)\eta coo + r^2 P hea^{(t)}\eta hea) + r^3 P fan^{(t)}))dt$$

Where
$E(t_f)$: the integral of power in HVAC system;
$P_{sup}(t)$: the cooling equal energy at t time;
$\eta_{coo}$: cooling device efficiency;
$P_{hea}(t)$: the heating equal energy at t time;
$\eta_{hea}$: heating device efficiency;
$P_{fan}(t)$: the air supply fan system equal energy at t time;
$E_Y(t_f)$: the integral of power in HVAC system under correction Y coefficient;
$Y^1$: correction coefficient of cooling system;
$Y^2$: correction coefficient of heating system;
$Y^2$: correction coefficient of air supply fan system.

Occupants Model $$H(x) = -\Sigma_{i=1}^{m} P(V_i)\log_2(P(V_i))$$

$$H(Y|X) = \Sigma_{i=1}^{m} P(X=V_i)H(X|V_i)$$

Where
$H(X)$: the information entropy of the set;
$P(V_i)$: the probability of getting the ith class value when randomly selecting one from the dataset X.
$H(Y|X=V_i)$: the entropy of Y among only those instances in which X has value $V_i$, named "specific conditional entropy".
$P(X=V_i)$: the probability of $V_i$ in the dataset of X.

Although mathematical notation has been used above, it will be understood that these models will typically be expressed using the grammar and syntax of the Energy-Plus™ modeling software, or in another suitable modeling system.

In their untrained form, the models express the fundamental thermal relationships by which heat is stored and propagated by conduction, convection and radiation mechanisms. The models also express in statistical terms how occupants behave inside the structure as a function of time. The models are then populated with data reflecting the static conditions associated with the structure. This may be viewed as a first level of model population. Then the models are further populated to reflect the dynamic behavior of the structure. This is done through simulation. The simulations are then compared with real operating data and the comparisons are used to calibrate the simulation models 144.

Figure 4:
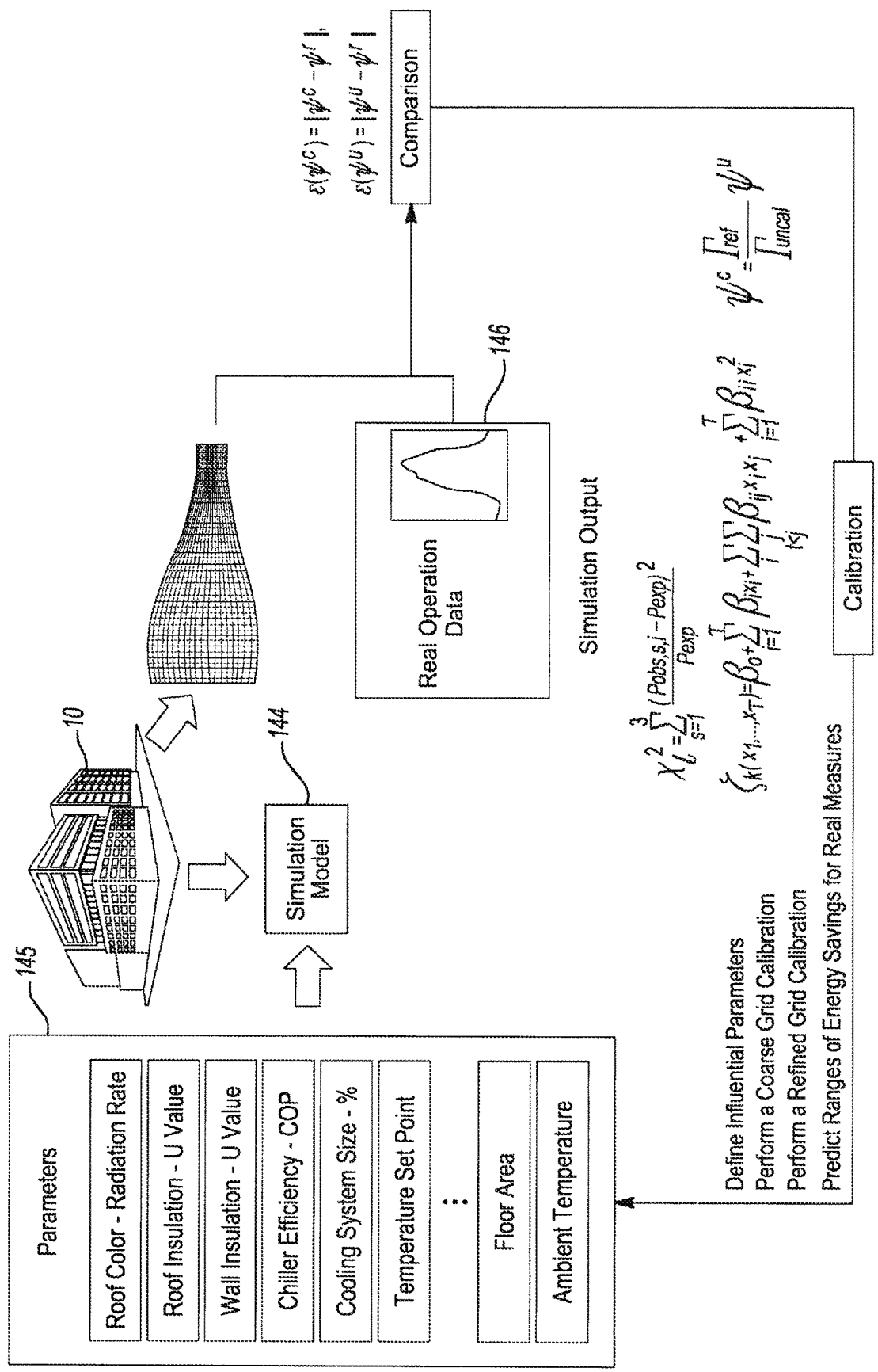
FIG. 4 illustrates a calibration method by which the neural network may be trained.

The manner of performing these two levels of model population and the subsequent model calibration is shown in FIG. 4. As illustrated, the simulation models 144 are preferably expressed in an EnergyPlus™ form or other suitable form for computer analysis and are populated with model parameters 145 reflecting properties of the actual structure 10. Such parameters include, for example, roof color (affecting its radiation rate), roof insulation value, wall insulation value, chiller efficiency, cooling system size, floor area. The parameters 145 also include certain operation parameters, such as temperature set points. Thus the models now contain parameters that reflect the static properties, or generalized properties corresponding to a particular structure 10.

Next the simulation models are operated upon by a computerized simulation process that iteratively changes the initially assumed operating conditions and causes the models to calculate solutions or simulation output 146.

Finally, to calibrate the simulation models, the simulation output 146 is compared with real operation data and the results of the comparison are fed back to make adjustments to the parameters 145 as initially chosen. In this way the calibration process defines those parameters that are most influential and performs both a coarse grid calibration and a refined grid calibration of the simulation models. In this way the simulation models can be used to predict ranges of energy savings for real measures.

In addition to modeling the structure, the disclosed energy audit and optimization control system is also able to generate control instructions that may be fed back to the structure to induce energy optimization. In one embodiment these control instructions are fed back as control parameters that instruct the HVAC control system (and optionally other electronic control systems) to make changes to the HVAC component and other system settings to improve energy efficiency. In such an automated embodiment, the energy audit and optimization control system can either supply explicit commands to specific actuators within the structure (e.g., actuators that control heating and cooling equipment, adjust damper settings, change thermostat settings, and the like). Alternatively, the energy audit and optimization control system can affect control over energy usage by the structure, by supplying a control regimen or recipe to be used by HVAC control system and/or other electronically controlled systems used by the structure. For example, such control regimen could represent the entire control strategy for the winter season, with specific improvements made to optimize efficiency based on data from the energy audit stage.

Energy Audit Stage

Figure 3:
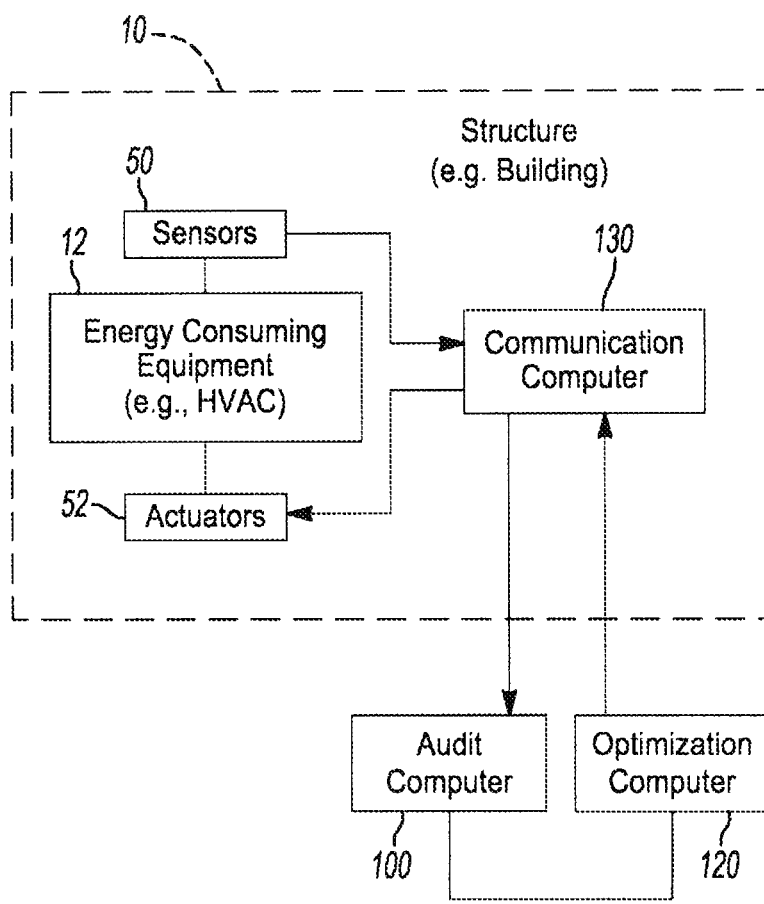
FIG. 3 is a block diagram illustrating one manner of interfacing the optimization control system with an exemplary structure.

Referring to FIG. 3, the structure 10 under audit and optimization control includes energy consuming equipment, such as the HVAC system 12. Associated with the energy consuming equipment are a plurality of sensors 50 and actuators 52. In general, the sensors 50 measure relevant conditions such as temperature, pressure, humidity, airflow, electric current, energy and heat flow and the operating states of various components of the energy consuming equipment. The actuators 52 perform functional changes to the energy consuming equipment, such as turning components on and off and changing variable settings, such as damper settings. In the illustrated embodiment, these actuators and sensors are coupled to a communication computer 130 that is programmed to collect and compile sensor readings and actuator instructions, and to communicate sensor readings to the audit computer 100 and to receive actuator instructions from the optimization computer 120. If desired the communication computer 130 may be implemented as a set of functions within a smart device, such as a smart power meter that meters electrical power being supplied to the structure.

While the audit computer 100 and optimization computer 120 have been depicted as separate computer devices in FIG. 2, these functions of these two computers can be implemented on a single computer device. Also while the audit computer 100 and optimization computer 120 have been depicted in a physical location outside structure 10, if desired these computers can be located within structure 10.

To support the audit stage, the sensors 50 associated with energy consuming systems within structure 10 may be equipped with wired or wireless communication links, allowing locally measured data to be collected and sent to the audit computer 100 via the communication computer 130. To support the optimization stage, at least some of the actuators 52 may be equipped with electronic control circuits, allowing them to be controlled by the optimization computer 120.

Generally speaking, associated with structure 10 are a collection of devices and/or systems that affect energy efficiency of the structure. These include the energy consuming equipment, such as the HVAC system 12, but also include the structural walls, roof, doors, windows, ventilation stacks and other systems through which energy may flow into or out from the structure. The disclosed optimization control technology exploits these devices and structures as energy efficiency control measures, which the audit computer 100 measures and the optimization computer 120 adjusts settings, to achieve optimal energy efficiency. While these energy efficiency control measures will naturally depend on the nature of the structure, the following is an exemplary list of energy efficiency control measures that would be applicable to a reasonably sophisticated commercial building. The person of skill in the art will appreciate that some of these control measures may not be implemented in a particular building; and other control measures not listed here may also be used.

TABLE 1

List of energy efficiency control measures;

1 Outdoor and exhaust Air Damper Faults and Control;
2 Static Pressure optimal Set;
3 Optimal HVAC Schedules by Actual Status;
4 Minimum VAV Terminal Box Damper Flow Reductions;
5 Control Setpoint Dead Bands and Night Optimal Set;
6 Chilled Water Differential Pressure Monitor;
7 Chilled Water Temperature Optimal Set;
8 Condenser Water Temperature optimal Set;
9 Water Differential Pressure Reset;
10 Water Temperature Optimal Set;
11 Supply Air Temperature Reset;
12 Exhaust Fan Control;
13 Fix Leaking Coil Valves;
14 Fix Low Refrigerant Charge;
15 Fix and re-calibrate Faulty Sensors;
16 Plant optimal low-load shutdown;
17 HVAC Optimal Start-STOP;
18 Refrigerated Case Lighting Controls;
19 Walk-In Refrigerator/Freezer Lighting Controls;
20 Refrigeration Floating Head Pressure;
21 Refrigeration Floating Suction Pressure;
22 Optimize Defrost Strategy;
23 Anti-Sweat Heater Control;
24 Evaporator Fan Speed Control;
25 Occupancy Sensors for Thermostats and Room Lighting;
26 Optimized Use of Heat Recovery Wheel;
27 Lighting Occupancy Presence Sensors;
28 Daylighting Controls;
29 Exterior Lighting;
30 Advanced Plug Load Controls;
31 Night Purge;
32 Advanced RTU Controls;
33 Elevator Lighting;
34 Cooling Tower Waterside Economizer;
35 Cooling Tower Optimal Controls;
36 Demand Control Ventilation;
37 Demand-Response: Setpoint Changes;
38 Demand-Response: Pre-Cool;
39 Demand-Response: Duty Cycle;

TABLE 1-continued

List of energy efficiency control measures;

40 Demand-Response: Refrigeration;
41 Demand-Response: Lighting; and
42 Demand-Response: Chilled Water Temperature Reset.

Optimization Stage

The optimization stage is performed by an optimization computer, which may be physically implemented by the same computer that serves as the audit computer, or it may be physically implemented by a separate computer coupled by hardwired connection or by network connection to the audit computer. In a networked configuration the audit computer and optimization computer can be connected via local area network or via a wide area network such as one coupled to the Internet. The optimization computer implements an artificial intelligence algorithm to determine how the energy efficiency and performance of the structure may be improved. In one embodiment the results of the optimization algorithm are used to generate electronic control instructions that are communicated to actuators disposed on or in the structure, causing the monitored energy consuming devices associated with that structure to adjust their settings and thereby improve the energy efficiency of the structure. As will be explained more fully below, the artificial intelligence algorithm comprises a learning-based model, such as a neural network model or set of models. The models are populated with data obtained from the structure, preferably as part of the audit stage, and these data define a nonlinear problem, which in the preferred embodiment, the optimization computer solves using a particle swarm optimizer.

Model Construction

The audit computer 100 uses parameter-based models and real-time control parameter data to capture relevant properties needed for the audit process. In the preferred embodiment the parameter-based models are constructed using a modeling tool known as EnergyPlus (™) available from the U.S. Department of Energy's (DOE) Building Technologies Office (BTO), and managed by the National Renewable Energy Laboratory (NREL). The modeling tool is available at energyplus.net. The real-time control parameter data are obtained from actual measured values taken from the structure using the sensors discussed above.

EnergyPlus Models

In the preferred embodiment the EnergyPlus tool constructs and supplies the audit computer 100 four models:
(1) a structure envelope model;
(2) a thermal model;
(3) a structure HVAC model; and
(4) a structure occupancy behavior model.

The structure envelope model captures the relevant properties about how the envelope of the structure is defined. The envelope defines the boundary between inside and outside of the structure (e.g., walls, roof, doors, windows, etc.). The thermal model captures the relevant properties about how heat flows within the structure and through the structure. This includes how radiant heat from the sun is absorbed and transferred into the interior of the structure and how heat convectively flows through the envelope of the structure. The structure HVAC model captures the relevant properties concerning the operating parameters of the HVAC system within the structure. The HVAC model thus models the on/off states of HVAC system components, and their operational settings. Lastly, the structure occupancy behavior model captures properties about how building occupants move throughout the building both positionally and as a function of time. The structure occupancy behavior model would thus record when occupants enter or exit the building, whether windows have been opened, and the extent to which different rooms are occupied throughout the day and night.

Collectively, the data captured in these four models represents a complex parameter space, describing how energy is utilized as a result of conditions external to the structure (e.g., weather, and qualities of the structure envelope), and conditions internal to the structure (e.g., caused by occupant behavior) and as a result of the operation of the HVAC systems associated with the structure.

Real-Time Control Parameters

In addition to the model-based parameters (developed using EnergyPlus), the audit computer also captures real-time data from the sensors deployed within the structure, as described above. If desired, these real-time data can be aggregated into sets of historical control parameter data. The audit computer uses these two ingredients—the model-based parameters and the control parameter data—to train a neural network that effectively learns how the control parameters within the actual physical structure correlate to the model-based parameters. The trained neural network thus acquires a powerful understanding of how control parameters that can be physically monitored, relate to theoretical (model-based) parameters that are grounded in principles of thermodynamics. To appreciate the significance, the trained neural network model can predict how the HVAC systems within the structure will behave under certain weather and occupancy patterns, even if those have not actually been experienced before. The trained neural network model can also predict how changes in certain control parameter settings (i.e., different HVAC equipment settings or operating conditions) will affect other systems when certain weather and occupancy patterns occur.

The trained neural network model empowers the audit computer to perform energy audits of the structure, without the need for an engineer to physically visit the structure site. This is possible because the trained neural network is able to form associations from which the audit computer can draw conclusions about how the structure is operating from an energy efficiency standpoint.

Neural Networks

Figure 5:
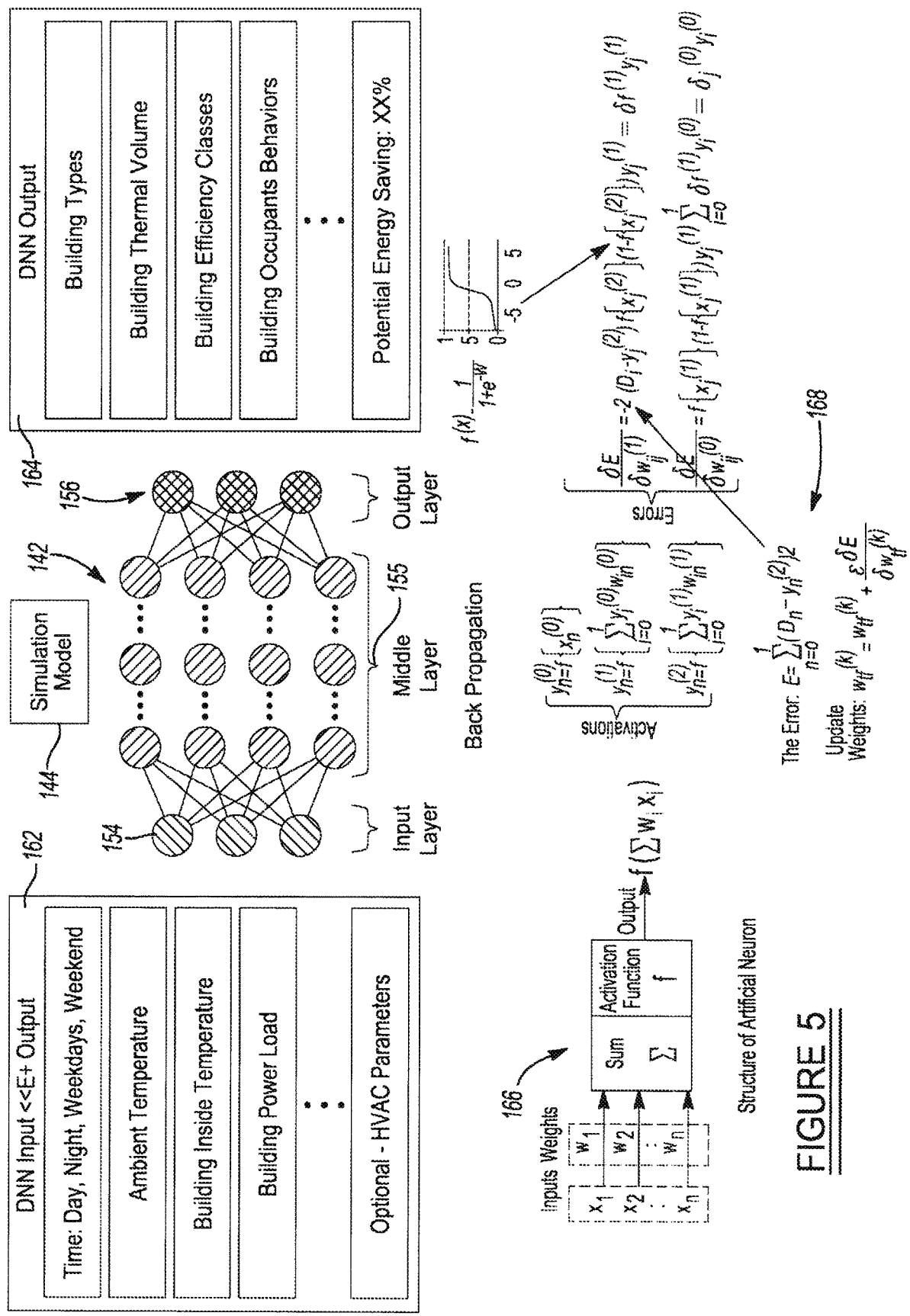
FIG. 5 illustrates a deep neural network (DNN) that may be used to implement the optimization control system.

The presently preferred system uses a deep neural network (DNN) having the general structure illustrated in FIG. 5. The neural network 142 comprises a set of input layers 154, a set of middle layers 155 and a set of output layers 156. The input layers 154 receive DNN input parameters 162 that correspond to at least some of the parameters used in the simulation models 144. Examples of such input parameters include, time: day, night, weekdays, weekend; ambient temperature, structure (e.g., building) inside temperature, structure (e.g., building) power load; and optional HVAC parameters or other optional operating parameters.

Each neuron comprising the network has an artificial neuron structure shown at 166. The neural network 142 is configured to effect back propagation according to the equations shown at 168.

The output layer 142 supplies the DNN output 164, which may reflect predictions made by the neural network as to structure (e.g., building) types, thermal volume, efficiency classes; structure occupant behaviors; and potential energy saving.

Figure 6:
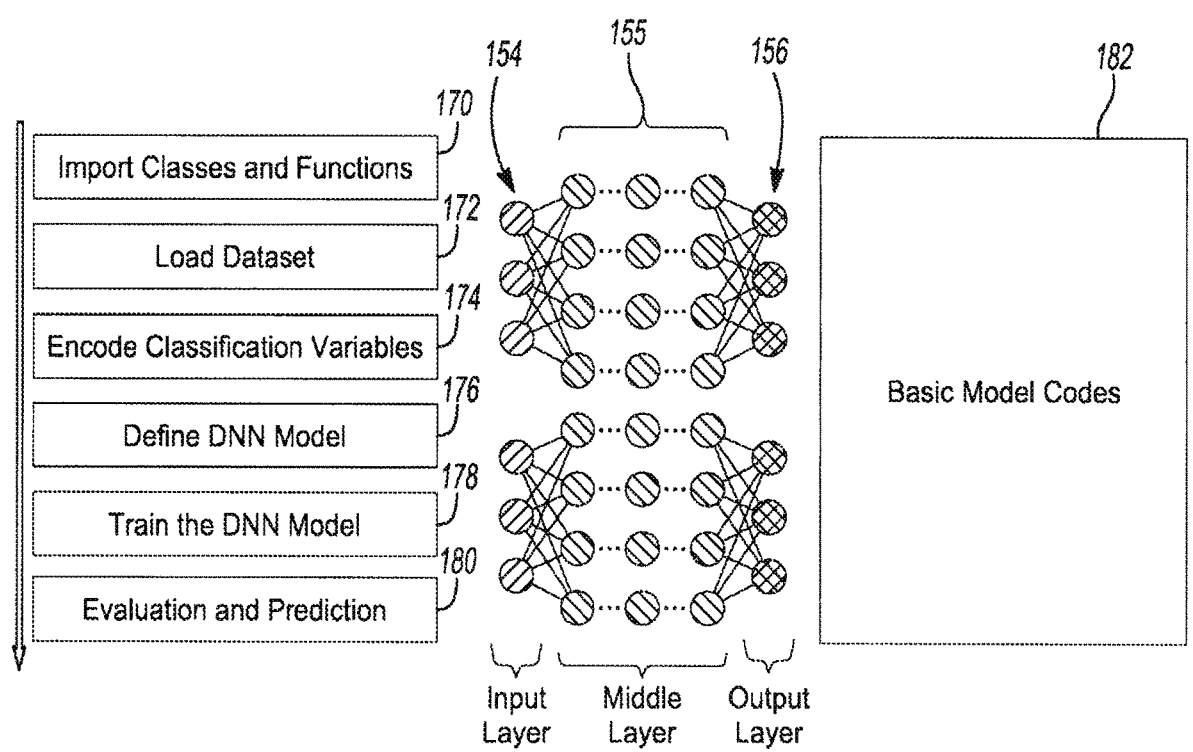
FIG. 6 is another illustration showing how the neural network is developed.

Although a number of different programming technologies can be used, a suitable DNN neural network can be implemented in Python using the Keras deep learning library. The process for generating the network using the Keras library is illustrated in FIG. 6. The process entails, importing the classes and functions 170 from the Keras library, loading the dataset to be used 172, encoding the classification variables 174 and defining the DNN model 176. Once defined the DNN model is then trained 178 and may then be used to perform evaluations and make predictions 180. An exemplary of the basic model Python code to generate the DNN models has been shown at 182.

Below is one example basic DNN model:

```
import numpy
import pandas
from keras.models import Sequential, model_fromjson
from keras.models import load_model
from keras.layers import Dense
from keras.utils import np_utils
from sklearn import datasets
from sklearn import preprocessing
from sklearn.model_selection import train_test_split
from sklearn.preprocessing import LabelEncoder
seed=7
numpy.random.seed(seed)
BuildingEE=datasets.load_Bee( )
X, Y, labels=BuildingEE.data, BuildingEE.target, BuildingEE.target_names
X=preprocessing.scale(X)
encoder=LabelEncoder( )
encoder.fit(Y)
encoded_Y=encoder.transform(Y)
y=np_utils.to_categorical(encoded_Y)
def build_model( ):
Input_dim=20
N_nmuber=Input_dim*2
Output_dim=8
model=Sequential( )
model.add(Dense(Input_dim, input_dim=Input_dim, init='normal', activation='relu'))
for i in range(Output_dim):
    model.add(Dense(N_nmuber,activation='relu'))
model.add(Dense(Output_dim,init='normal', activation='sigmoid'))
model.compile(loss='categorical_crossentropy', optimizer='adam', metrics=['accuracy'])
return model
def save_model(model):
    # saving model
    json_model=model.tojson( )
    open('beemcc_model_architecture.json', 'w').write(json_model)
    # saving weights
    model.save_weights('beemcc_model weights.h5', overwrite=True)
    print('Model saved!')
def load_model( ):
    # loading model
    model=model_from_json(open('model_architecture.json').read( ))
    model.load_weights('beemcc_model weights.h5')
    model.compile(loss='categorical_crossentropy', optimizer='adam')
    print('Model loaded!')
    return model
def fit_save_model( ):
    # build
    model=build_model( )
    model.fit(X_train, Y_train, nb_epoch=200, batch_size=2, verbose=2)
    # save
```

```
save_model(model)
X_train, X_test, Y_train, Y_test=train_test split(X, y,
    test_size=0.3, random_state=seed)
fit_save_model( )
model=load_model( )
predictions=model.predict_classes(X_test, verbose=2)
output=[labels[x] for x in predictions]
print(output)
```

Figure 7:
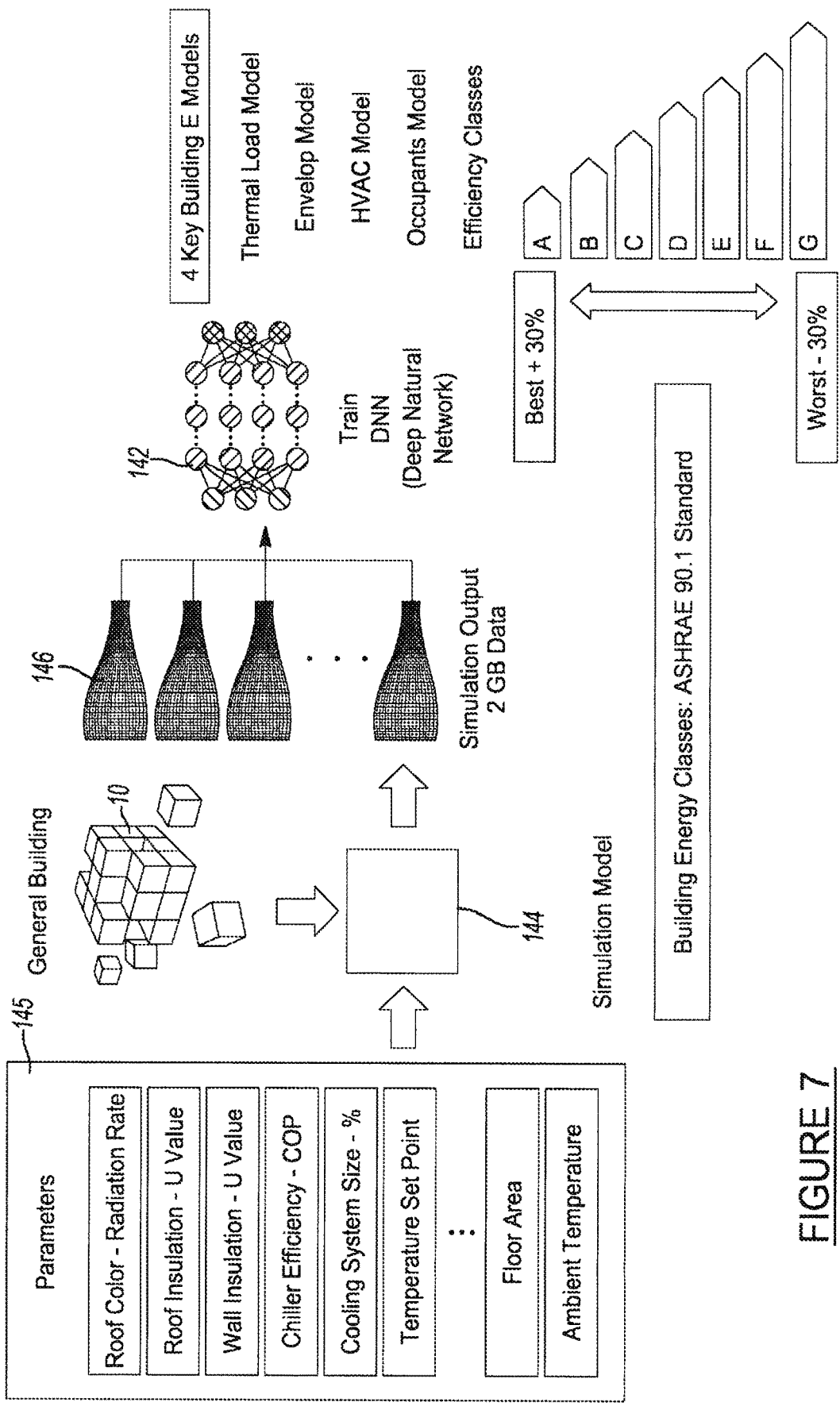
FIG. 7 illustrates how the neural network is trained using simulation output data.

Referring to FIG. 7, the neural network 142 is trained using the simulation output 146 generated by the simulation model 144 (as described in connection with FIG. 4). The neural network, so trained, is a now able to make predictions relative to the four models established when developing the simulation model 144. These are the four key structure models used to perform energy audits, namely, the thermal load model, the envelope model, the HVAC model and the occupants model.

Figure 8:
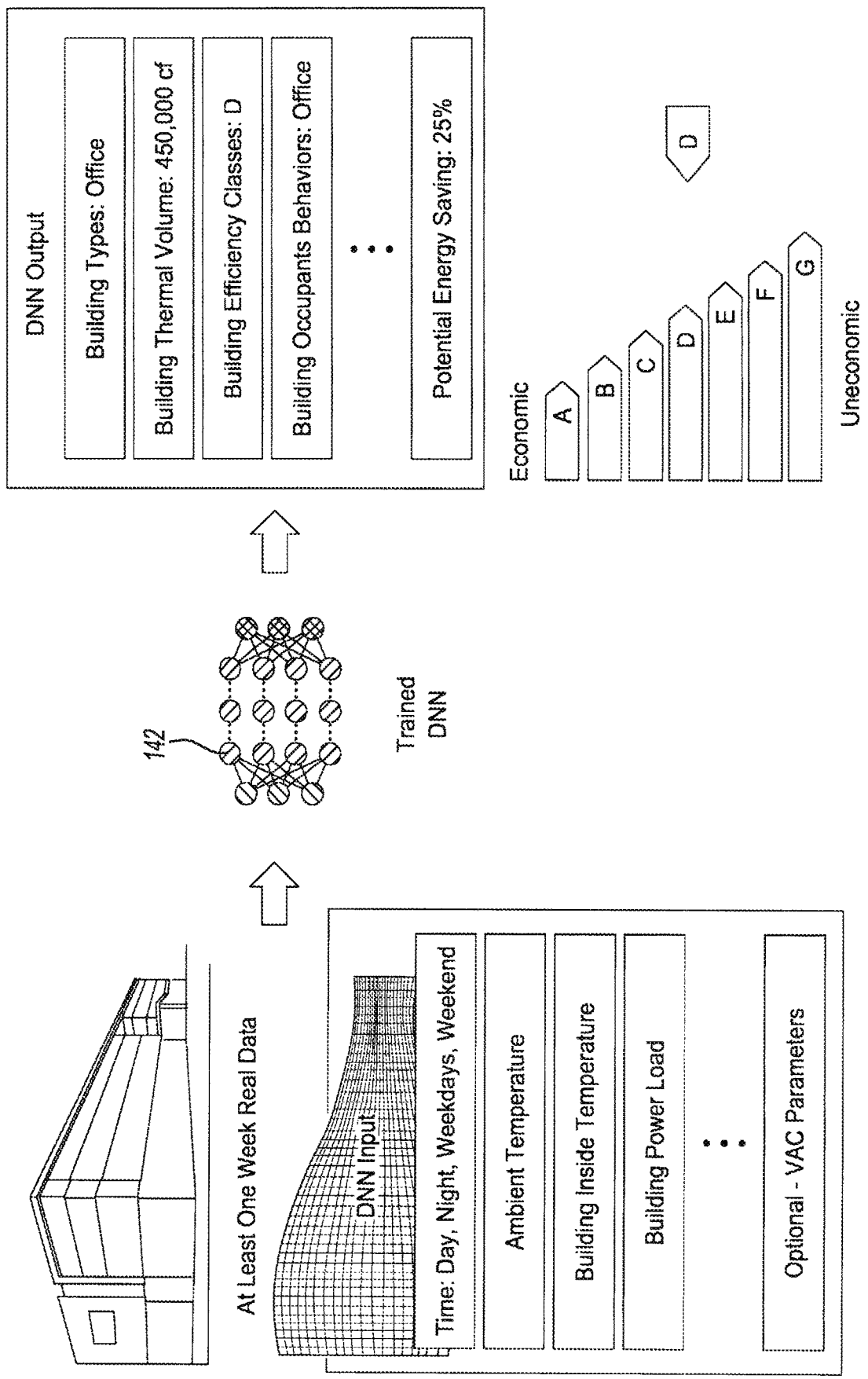
FIG. 8 illustrates how the trained neural network functions in performing the automated energy audit.

In performing the energy audits, the trained neural network 142 is able to make predictions when real data is supplied at the DNN input. For example, in the exemplary configuration illustrated in FIG. 8, the neural network 142 can predict that the structure type or building type is an "office" and that it has a thermal volume of 450,000 cubic feet. The neural network is able to predict that the structure has a D class efficiency designation and that the occupants exhibit a behavior typical of office workers. In addition, the neural network 142 is able to predict that a potential energy savings of 25% is possible for the structure whose real data are supplied at the DNN input.

The neural network prediction that a 25% energy savings is possible has been made in an entirely automated fashion. The energy audit has required no audit engineers to visit the premises. All that was required was to supply the trained neural network 142 with real data from the structure. In the illustrated example, one week of real data was sufficient to produce the predictions illustrated.

CNN And RNN Neural Networks

In the preferred embodiment, the neural network 142 may be implemented as a deep neural network (DNN) using multiple disparate neural network configurations, including a recurrent neural network (RNN) and a convolutional neural network (CNN). A CNN neural network is good at image recognition and the preferred embodiment uses the CNN to learn the overall shape of the performance curve of the structure. The focus of the CNN is thus on the shape of the performance data, as opposed to the actual data values themselves. The CNN is thus good at learning to recognize performance curves, which may be similar among structure types, even though different structures of that type may be quite different in size.

The RNN neural network is good at optimizing results and this thus good at predicting individual output control parameters. When the RNN neural network is fed with measured parameters it is good at predicting how the control parameters need to be set at different times of the day.

The neural network 142, comprised of these CNN and RNN components receives real-time data from parameter settings and sensors within the structure and performs predictions that control how the parameters will be controlled. Thus the neural network 142 can be seen as the master controller that tells the individual subsystems within the structure how to perform. As will be explained below, the neural network 142 also receives input from the particle swarm optimization process and in this way the neural network learns what the optimal behavior of the structure should be.

The neural network 142 is trained using two separate training mechanisms. The neural network 142 is first trained using the simulation models 144. These models are preferably constructed using the EnergyPlus tools to define a set of static models representing knowledge about how the structure functions from the standpoints of thermal loading, structure envelope, HVAC system operation and occupant behavior.

The second training mechanism provides dynamic information about the structure. To perform the second training mechanism, the simulation models are fed with a series of time-varying conditions that cause the model to predict different responsive behaviors and these behaviors are used to further train the neural network 142. The second training mechanism thus provides the neural network with information about predicted energy consumption levels under time-varying dynamic conditions.

Figure 9:
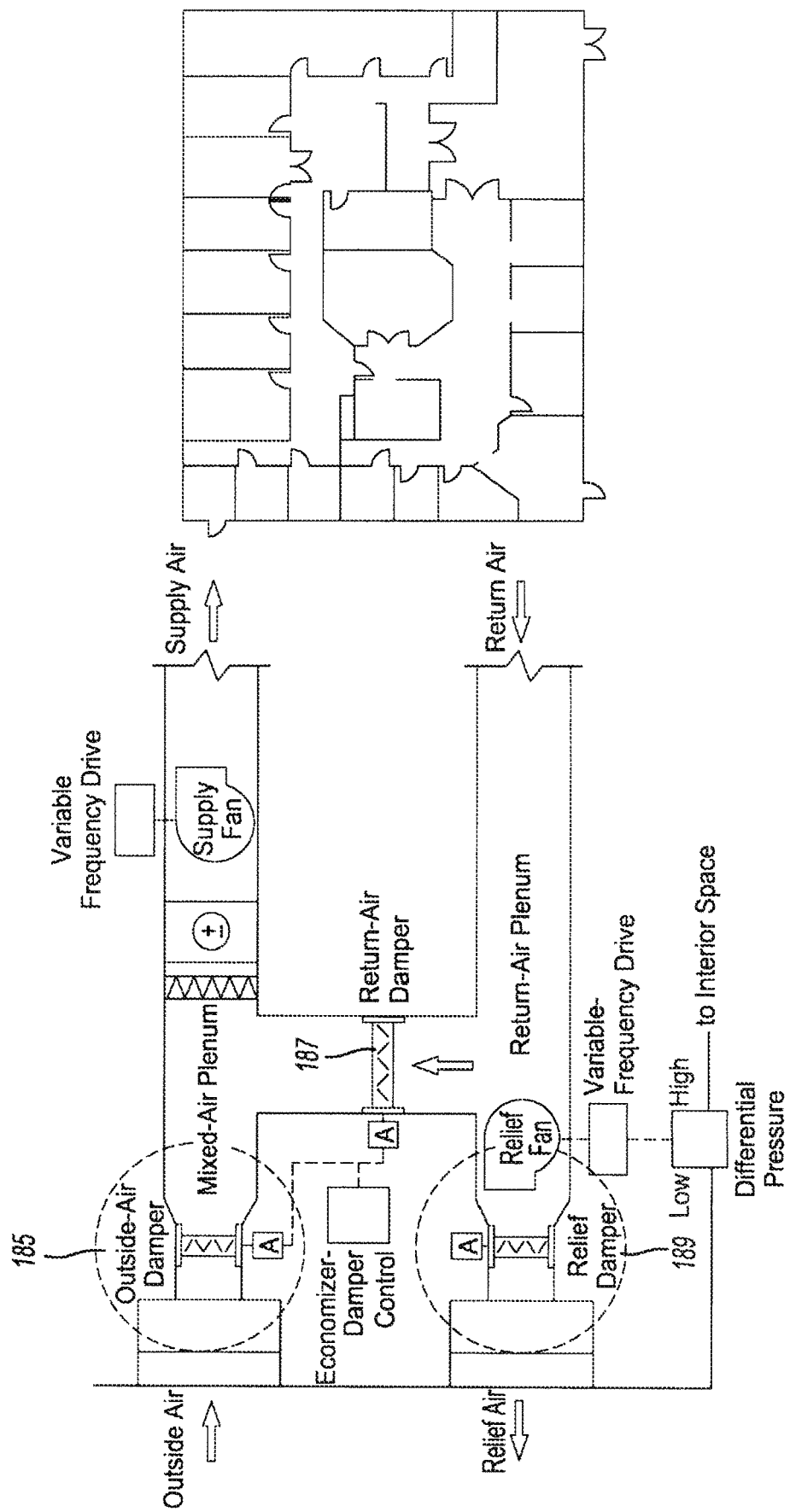
FIG. 9 is a system block diagram of an economizer device, useful in understanding how the neural network can identify inefficiencies.

By way of example the second training mechanism might model the performance of an economizer such as that illustrated in FIG. 9. The second training process generates simulation results showing economizer performance under different environmental conditions as damper and fan settings are changed.

Finding Inefficiency Measures

Figure 10:
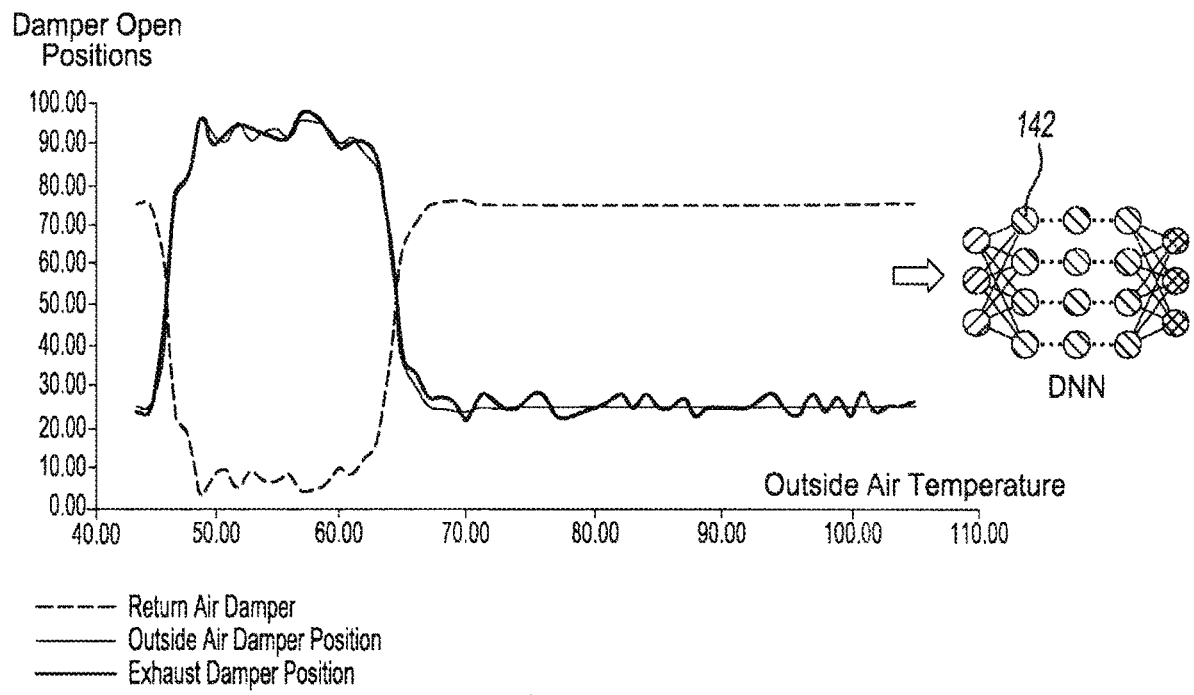
FIG. 10 is a series of graphs of economizer damper positions as a function of outside air temperature, illustrating different return air, outside air and exhaust damper positions.

The neural network can be used to find inefficiency measures, that is, to predict which parameters would lend themselves to being optimized. Consider the economizer control system illustrated in FIG. 9. The respective outside air damper 185, return air damper 187 and exhaust or relief air damper 189 are each set to different settings, which will differ, depending on the outside air temperature. Thus as shown in FIG. 10, when the outside air temperature is between 50 and 60 degrees, the return air damper 189 is nearly shut (between 0% and 10% open) while the outside air damper 185 and exhaust damper 189 are essentially open (between 90% and 95% open).

However when the outside air temperature rises above about 70 degrees, the damper settings dramatically change, with the return air damper 187 being set at about 75% open, while the outside air damper 185 and exhaust air damper 189 being set to about 25% open.

The neural network 142 learns this behavior through the training process. Once trained, the neural network 142 can assess which damper operation strategies will produce efficient results and which do not. This is illustrated in FIGS. 11 and 12, which respectively show how the neural network assesses different strategies during summer and winter seasons.

Figure 11:
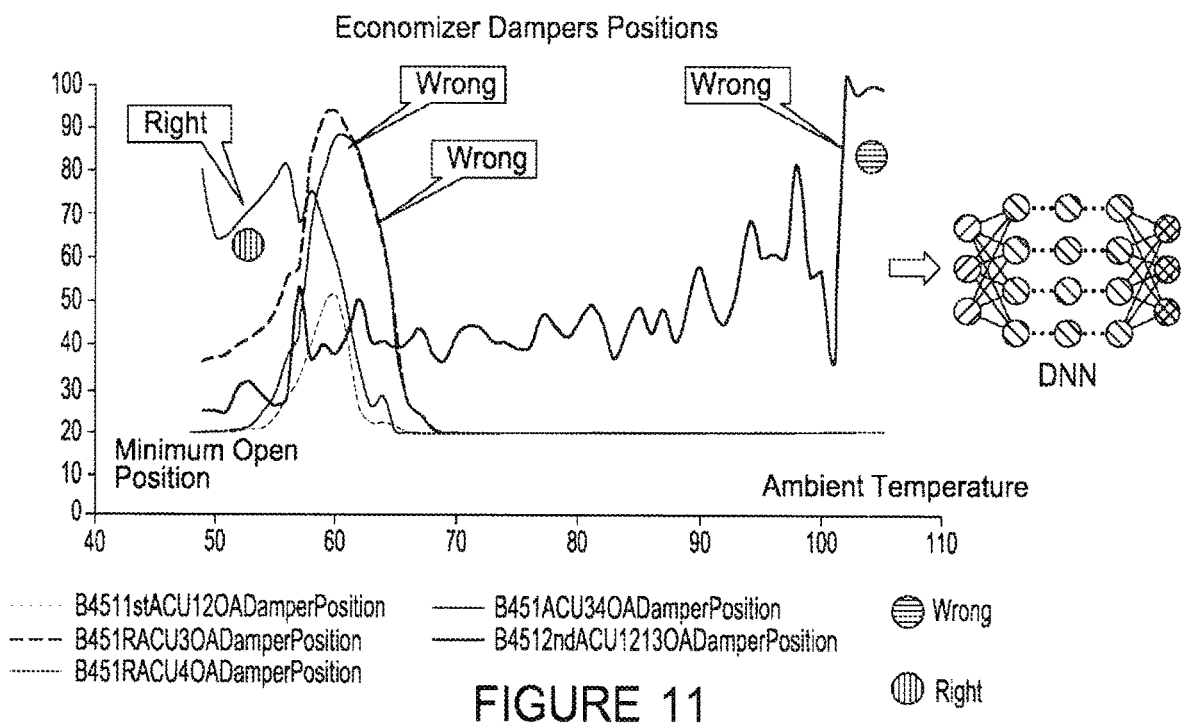
FIG. 11 is a series of graphs showing for the summer season how the neural network identifies the optimal damper position setting.

Referring to FIG. 11 (summer season) of the five different damper strategies examined, one is identified as the "Right" strategy, whereas the others are identified as "Wrong." Thus during the summer season, the neural network identifies that the "Right" strategy should be chosen for maximum efficiency. This strategy shows that the damper can be controlled according to ambient temperature, with effective results, until ambient temperature rises above about 65 degrees. When above 65 degrees, the economizer should be set to the minimum open position of about 20%.

Figure 12:
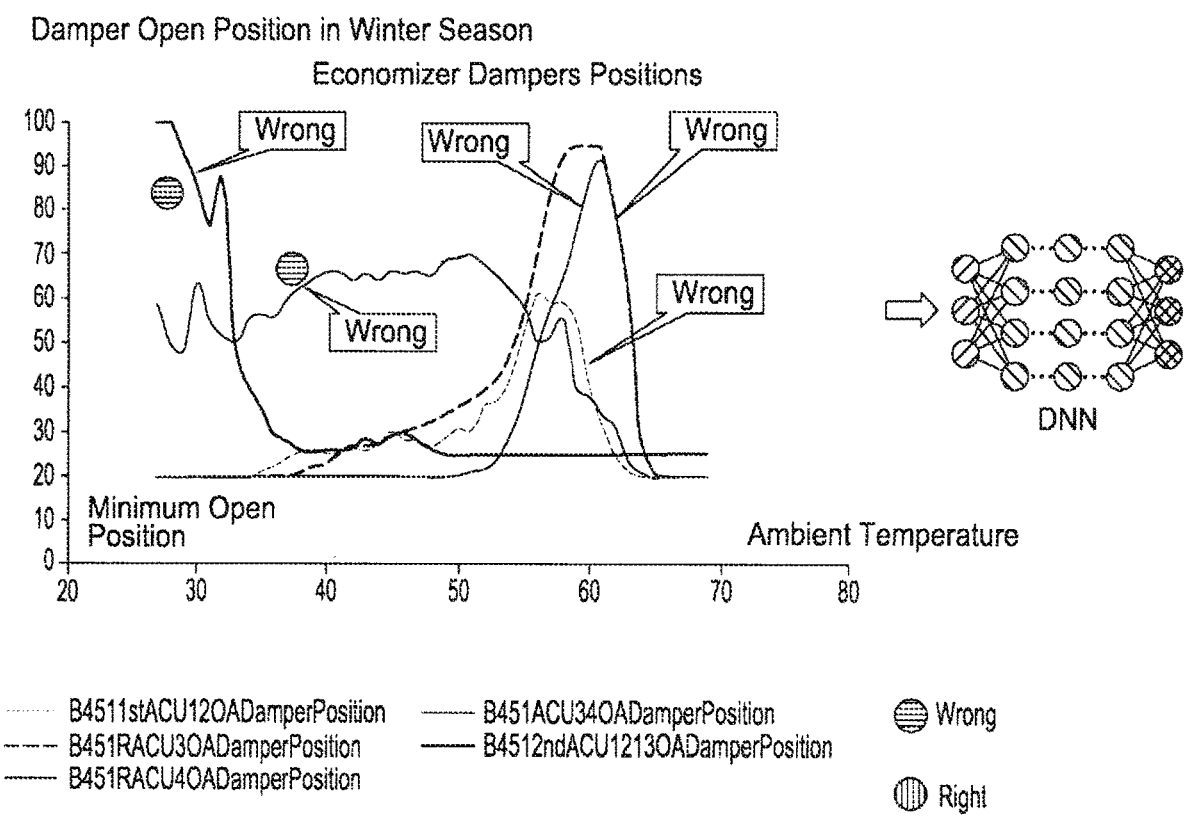
FIG. 12 is a series of graphs showing for the winter season how the neural network recognizes that all "damper open" settings are wrong, hence the damper should be closed.

Contrast this with the assessment shown in FIG. 12 (winter season). In the winter season the neural network assesses all damper control strategies to be "Wrong." In other words, none of the strategies are useful during winter, and the economizer would best be shut down.

Particle Swarm Optimizer

From the discussion above, the trained neural network provides a powerful tool in conducting an energy audit, automatically and without the need for a trained engineer to visit the structure site-which in some instances may not be physically possible. The ability to conduct such energy audits is itself extremely valuable, however the disclosed system can do far more than this. The optimization computer can examine all of the control parameters and operating conditions and generate an optimal control parameter regime to optimize energy efficiency of the structure. To do this, the optimization computer uses a sophisticated particle swarm optimization algorithm.

Particle swarm optimization (PSO) is a computational method that optimizes a problem by iteratively trying to improve a candidate solution with regard to a given measure of quality. It solves a problem by having a population of candidate solutions, here dubbed particles, and moving these particles around in the search-space according to simple mathematical formulae over the particle's position and velocity. Each particle's movement is influenced by its local best known position, but is also guided toward the best known positions in the search-space, which are updated as better positions are found by other particles. This is expected to move the swarm toward the best solutions.

Figure 13:
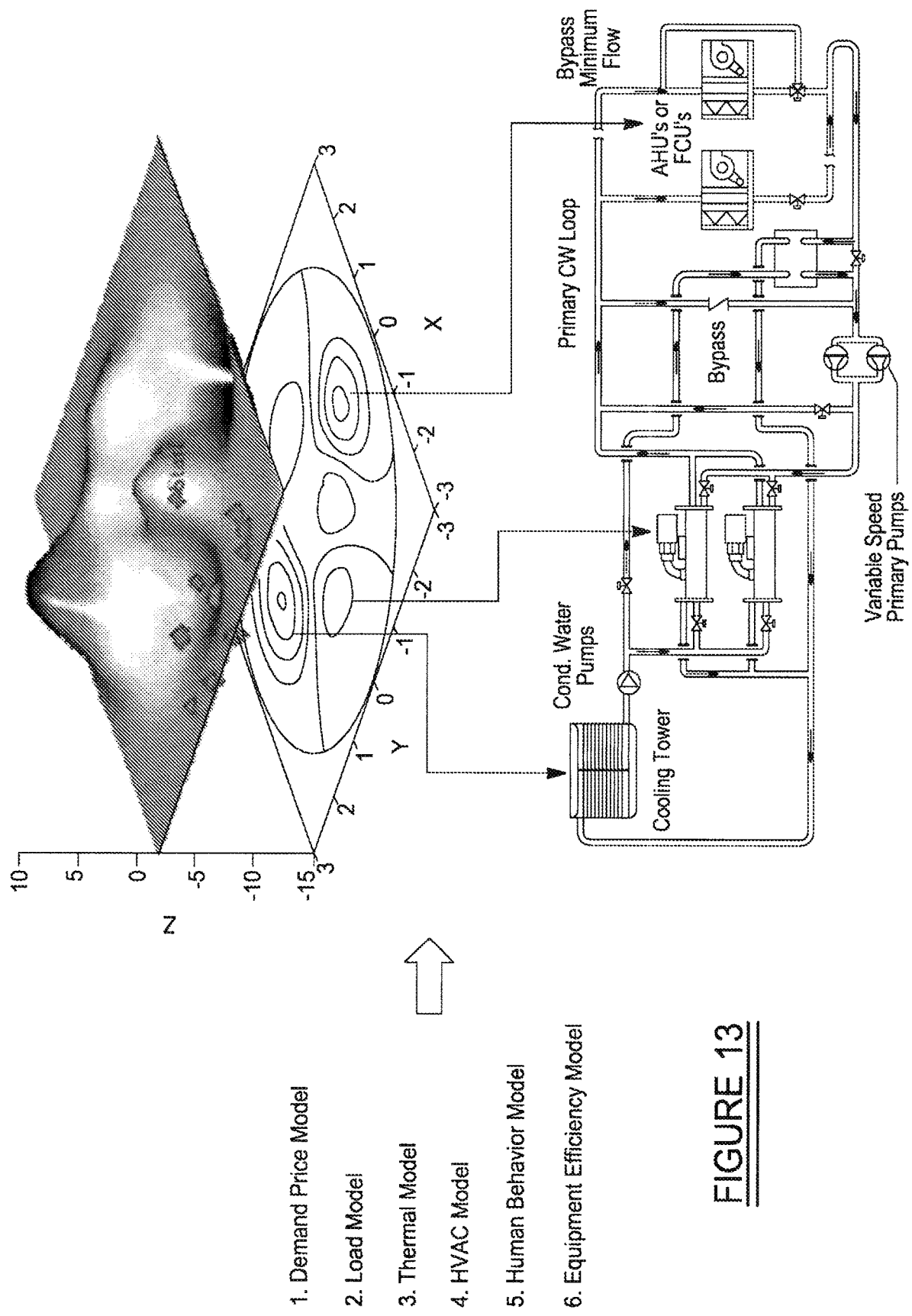
FIG. 13 is a topological representation of the solution space covering a set of control parameters associated with an exemplary structure, the representation being useful in understanding the particle swarm optimization performed by the optimizing control system.

In the preferred embodiment, an exemplary neural network might have on the order of 10 to 963 model parameters and 5 to 125 control parameters supplying the inputs. The network might have, for example, 15 adaptive layers, providing 15 outputs. Given the large number of different control parameter and condition permutations, the optimization problem spans a very large search space. Illustrated in FIG. 13 the search space may be represented as a topographical map having local peaks and valleys. The candidate solutions are initially distributed across this space. The algorithm causes each candidate solution or particle to move, where the movement of each particle is influenced by its own local best known position, but also influenced by the best known positions discovered by other particles in the search space. After successive iterations, the algorithm causes the particles to swarm towards the optimal solution.

Figure 15:
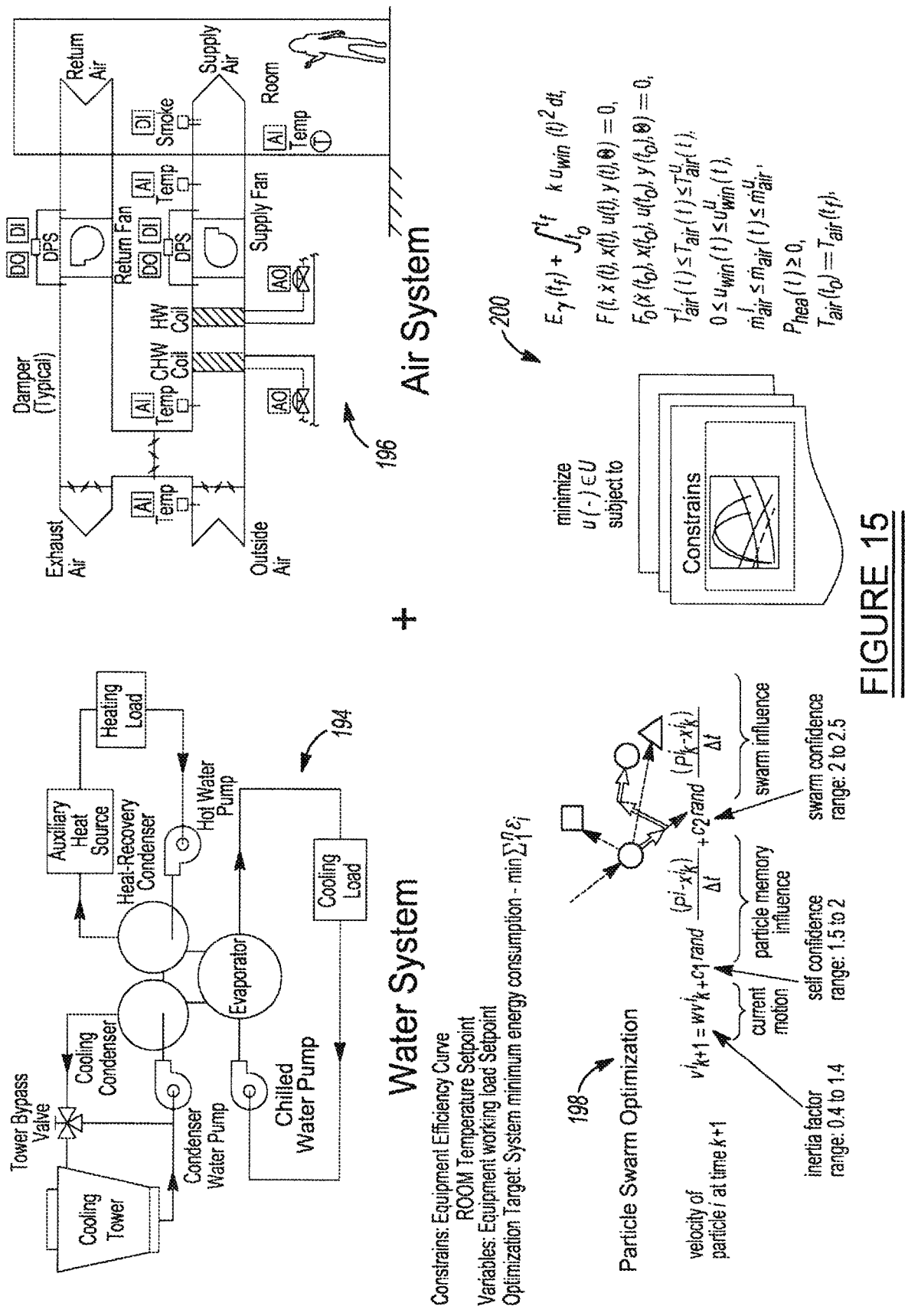
FIG. 15 is a performance optimization diagram useful in understanding how the particle swarm optimization improves HVAC system performance.

FIG. 15 depicts a presently preferred embodiment for the configuring the particle swarm optimization algorithm. In FIG. 15 the system being optimized is an exemplary HVAC system comprising a water system 194 and an air system 196. The particle swarm algorithm is shown at 198, which is subject also to the set of constraints 200.

Integration of Particle Swarm Optimization with Neural Networks

Figure 14:
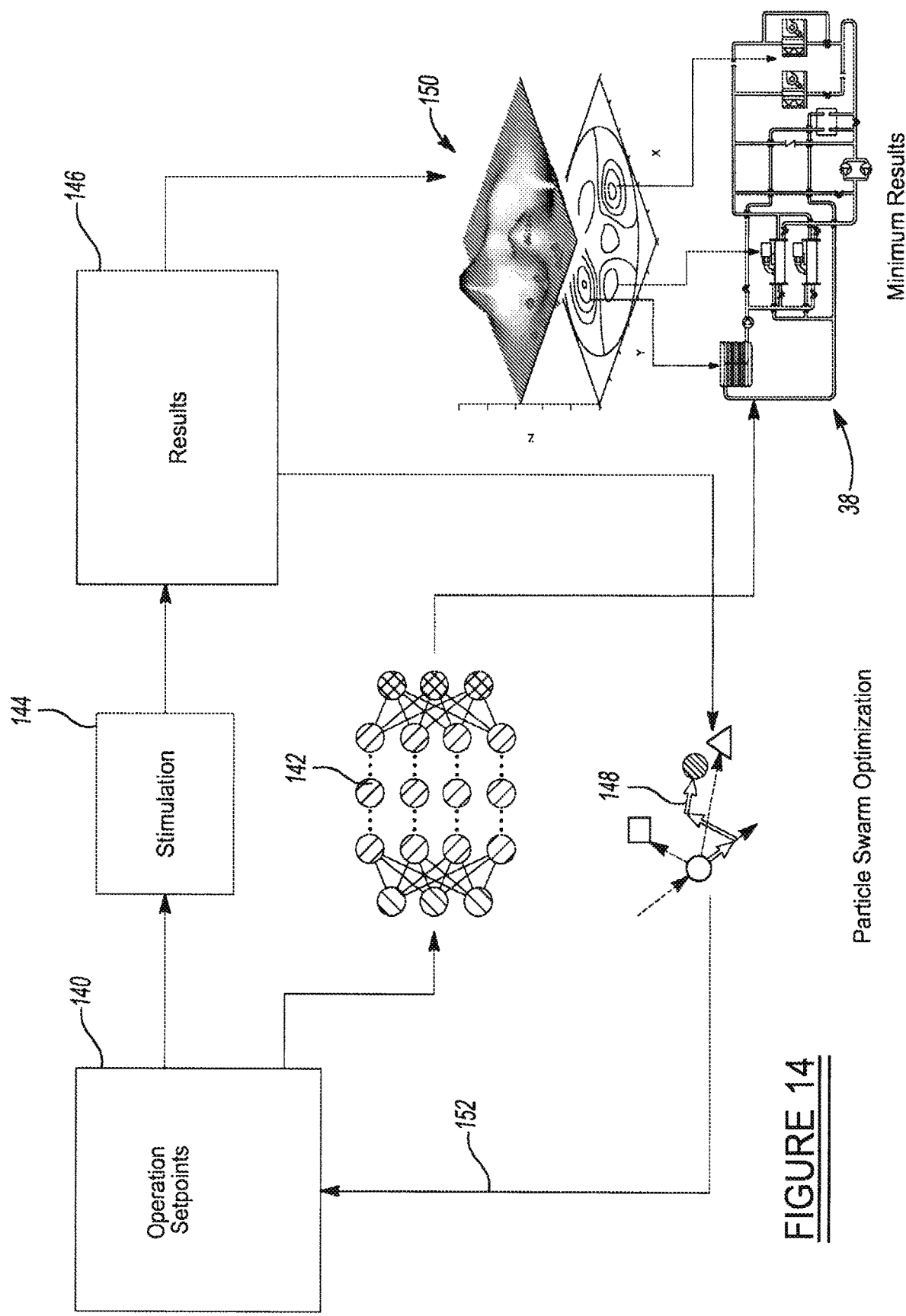
FIG. 14 is a data flow diagram illustrating how the output of the particle swarm optimization is fed back to further train the neural network.

FIG. 14 illustrates how the particle swarm optimization is integrated with the neural network. The operation parameters set points 140, represent the collection of controlled parameters within the HVAC system (or other system associated with the structure). These parameters are fed as inputs to the neural network 142, which in turn supplies control instructions to operate the HVAC system 38. Concurrently, the operation parameters set points 140 are supplied to the EnergyPlus simulation models 144, which generates simulation results 146 that are fed to the particle swarm optimization process. As illustrated diagrammatically at 150, the results 146 are mapped onto a topological space 150 having points that correspond to specific operation parameters within the HVAC system 38. The particle swarm process finds the optimal settings for these operation parameters, to achieve the optimally efficient HVAC system.

Notably, the results of the particle swarm optimization are fed back as at 152 as adjustments to the operation parameters set points. As a result of this feedback from the particle swarm optimization process, the simulation models 144 are changed to reflect the discoveries made by the particle swarm optimization, and the neural network 142 is also supplied with the optimized operation parameters set points that have been improved by the particle swarm optimization. Because the neural network 142 is controlling the HVAC system 38, the performance of the HVAC system is thus optimized by virtue of the feedback from the particle swarm optimization process 148.

The particle swarm optimization process 148 takes as inputs a collection of operating parameters of the HVAC system at work. These might include air pressure set points, inside and outside temperature set points, air flow set point, cooling water flow set point, circulating water flow set point, and the like. The particle swarm optimization process assess the whole system energy consumption achieved for these set points and discovers the minimum energy consumption, giving a predefined set of constraints. These constraints may include, for example, occupant comfort parameters, such as temperature, humidity, ventilation, and the like. The particle swarm, in essence examines how the system as a whole behaves when the individual control parameters change over their allowable ranges. To do this, the particle swarm optimization process 148 uses the results 146 as generated by the simulation models 144. As illustrated in FIG. 14, these simulation models generate results 146 given the operation parameter set points 140 as inputs. Thus the optimizer is discovering the optimal operation parameter set point settings for a particular set of conditions (weather, structure occupancy, etc.).

Deep Reinforcement Learning

Figure 16:
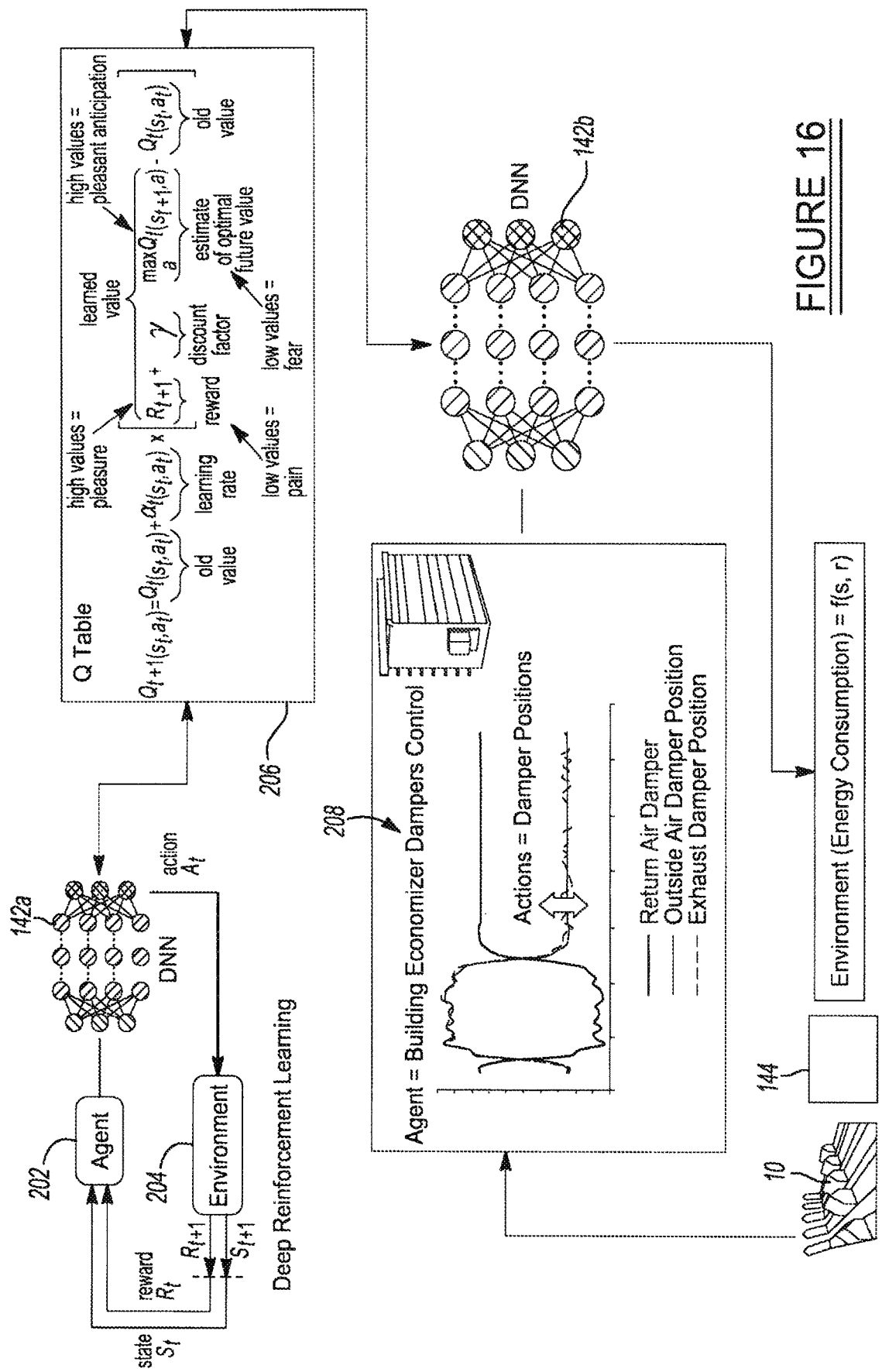
FIG. 16 is a data flow diagram illustrating how deep reinforcement learning optimization.

In conjunction with the above disclosed techniques, a deep reinforcement learning (DRL) process can be utilized. An example of DRL has been illustrated in FIG. 16. In the DRL embodiment a software agent 202 responds to information from the environment, shown diagrammatically at 204 and trains the dynamic neural network (DNN) 142a. The DNN 142a supplies actions A to the environment 204, in feedback fashion.

The DNN 142a works in conjunction with a Q table 206 that stores values for every state vs every action possible in the environment. This Q table is also mapped to DNN 142b, which can be a separate neural network, or an instance of DNN 142a. DNN 142b is used to drive the settings of coupled HVAC equipment, such as to manage the damper positions as illustrated at 208. The DNN 142b is also coupled to the simulation models 144 which in turn regulate the environment (i.e., energy consumption) by the structure 10.

Deployment Scenarios

Figure 17A:
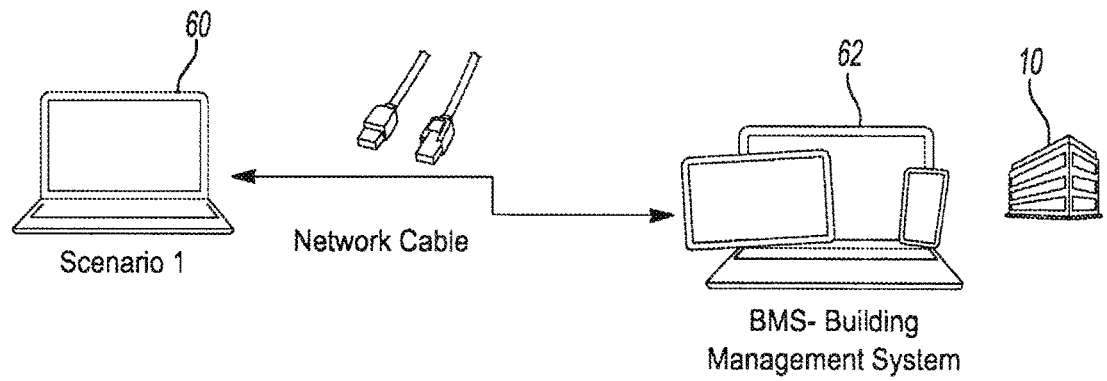
FIG. 17 (FIGS. 17a, 17b, 17c) illustrate different application scenarios for deploying the optimization control system.
Figure 17B:
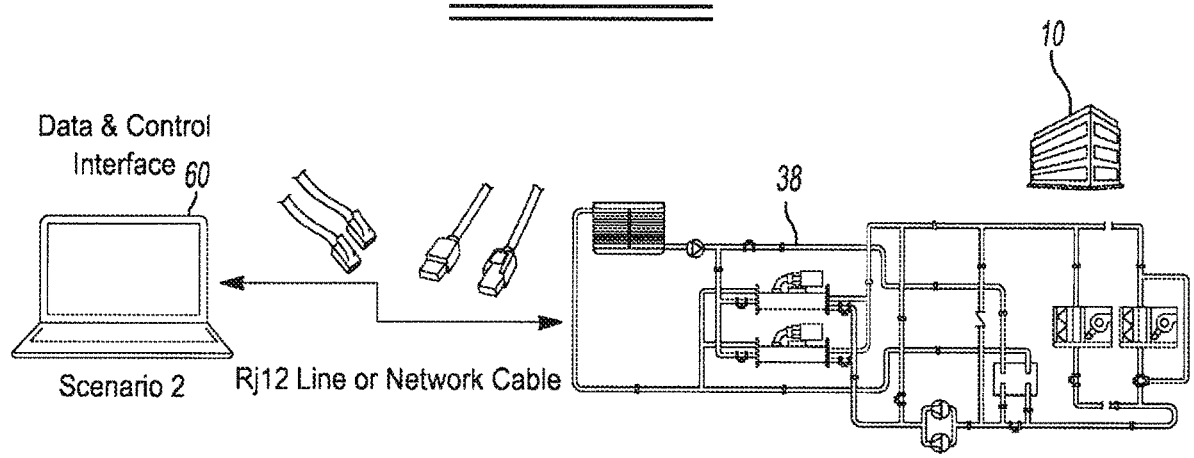
Figure 17C:
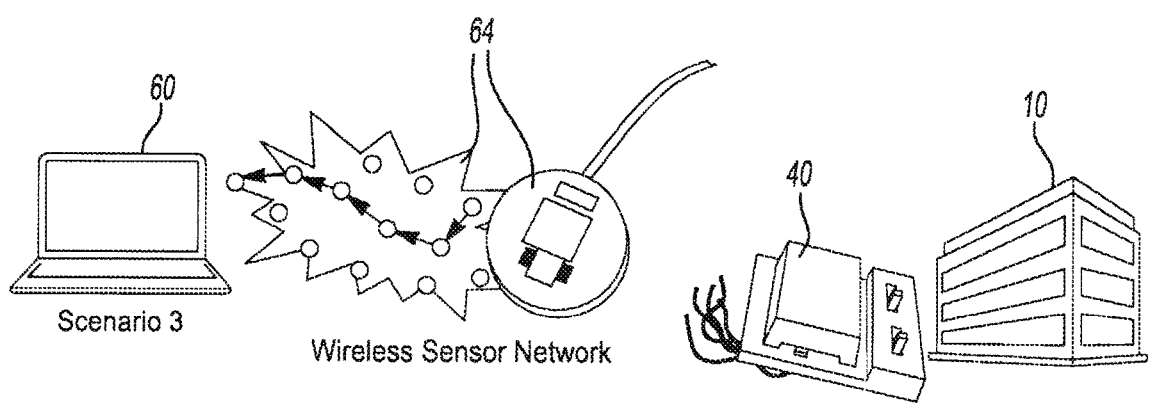

FIGS. 17A, 17B and 17C illustrate three different ways of deploying the optimization control system with a computer 60. As illustrated, the computer 60 is performing both the functions of the audit computer 100 and the optimization computer 120 (FIG. 3). FIG. 17A interfaces with a building management system 62, which is turn controls the systems within the structure 10. A suitable network cable can be used to connect computer 60 with the building management system. Alternatively, a networked connection can be established over a local area network or wide area network, including over the Internet.

FIG. 17B illustrates how the computer 60 can be coupled via a serial connection, such as an RJ12 line or a network connection directly to the HVAC control system. If required the HVAC control system may include an intermediate communications computer 130 (FIG. 1) to couple with the computer 60. In the embodiment of FIG. 17B, computer 60 functions as a data and control interface for the HVAC control system 38.

FIG. 17C illustrates a wireless embodiment where the HVAC system is controlled by a wireless sensor network comprising small wirelessly communicating sensor nodes that may be deployed in suitable controllers, such as thermostat units 40.

Figure 18:
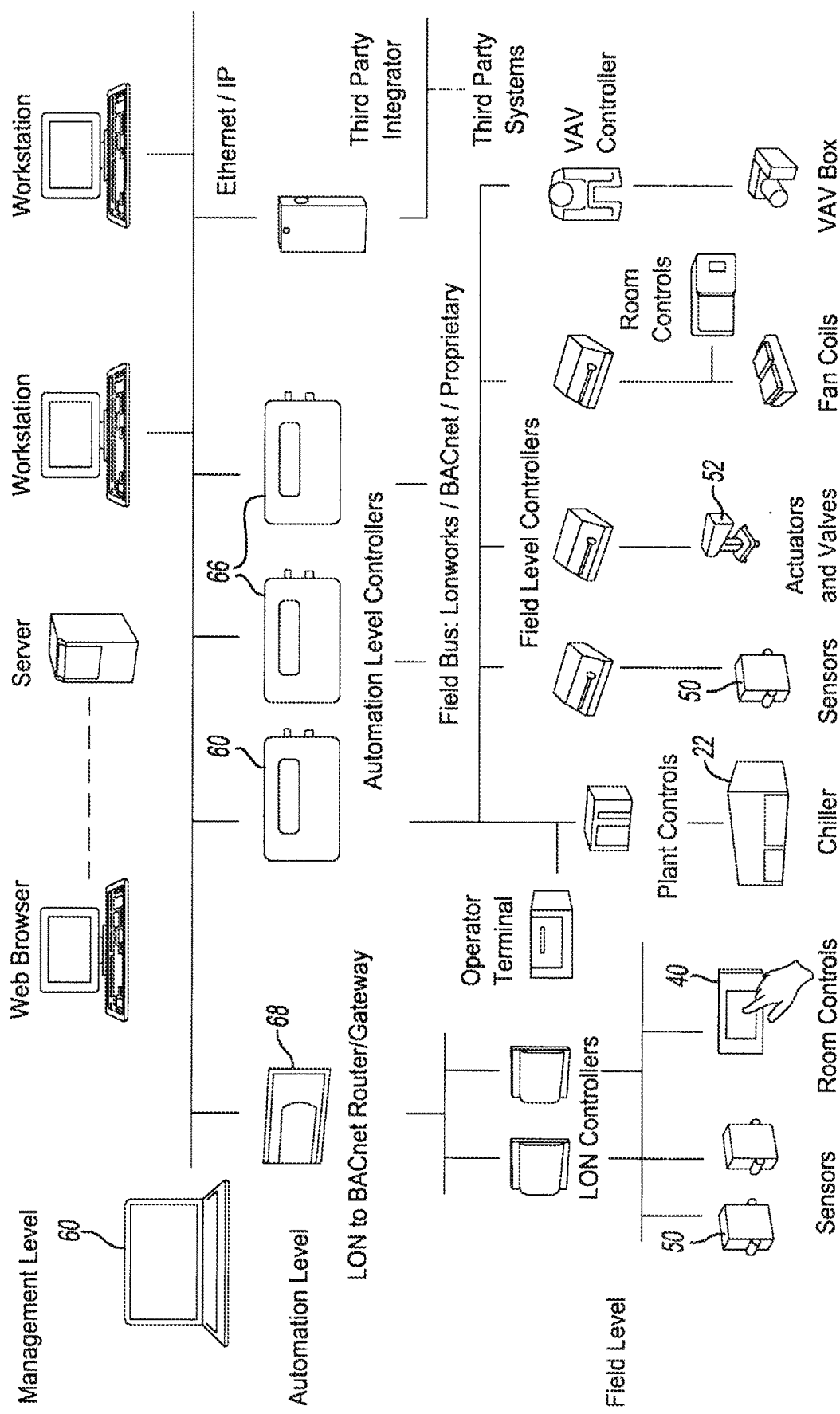
FIG. 18 illustrates a networked implementation of the optimizer control system.

In larger applications, it can be desirable to deploy the optimization control system on a computer 60 that interfaces with the electronic controllers and actuators within the structure, in a manner that utilizes the structures existing wiring and network topology. An example of this has been illustrated in FIG. 18. In FIG. 18 the sensors 50, actuators 52, room control thermostats 40, and other HVAC components such as the chiller 22, fan coils, VAV box and the like, are coupled to communicate over a LON works or BACnet bus, as illustrated. Automation level controllers 66 provide the local control over these HVAC components and these controllers 66 are in turn responsive to computer 60, which provides control strategies to be carried out by the automation level controllers 66. If needed, a router or gateway 68 provides connectivity between computer 60 and certain HVAC devices that may not be accessible through the automation level controllers.

In the embodiment of FIG. 18, the optimization control strategy, developed by the neural networks and particle swarm optimization functions, is supplied by computer 60 to the automation level controllers 66 as a control regimen which the controllers 66 carry out. If certain components cannot be accessed through the automation level controllers 66, computer 60 can effect direct control over those components by sending instructions through the router or gateway 68.

Figure 19:
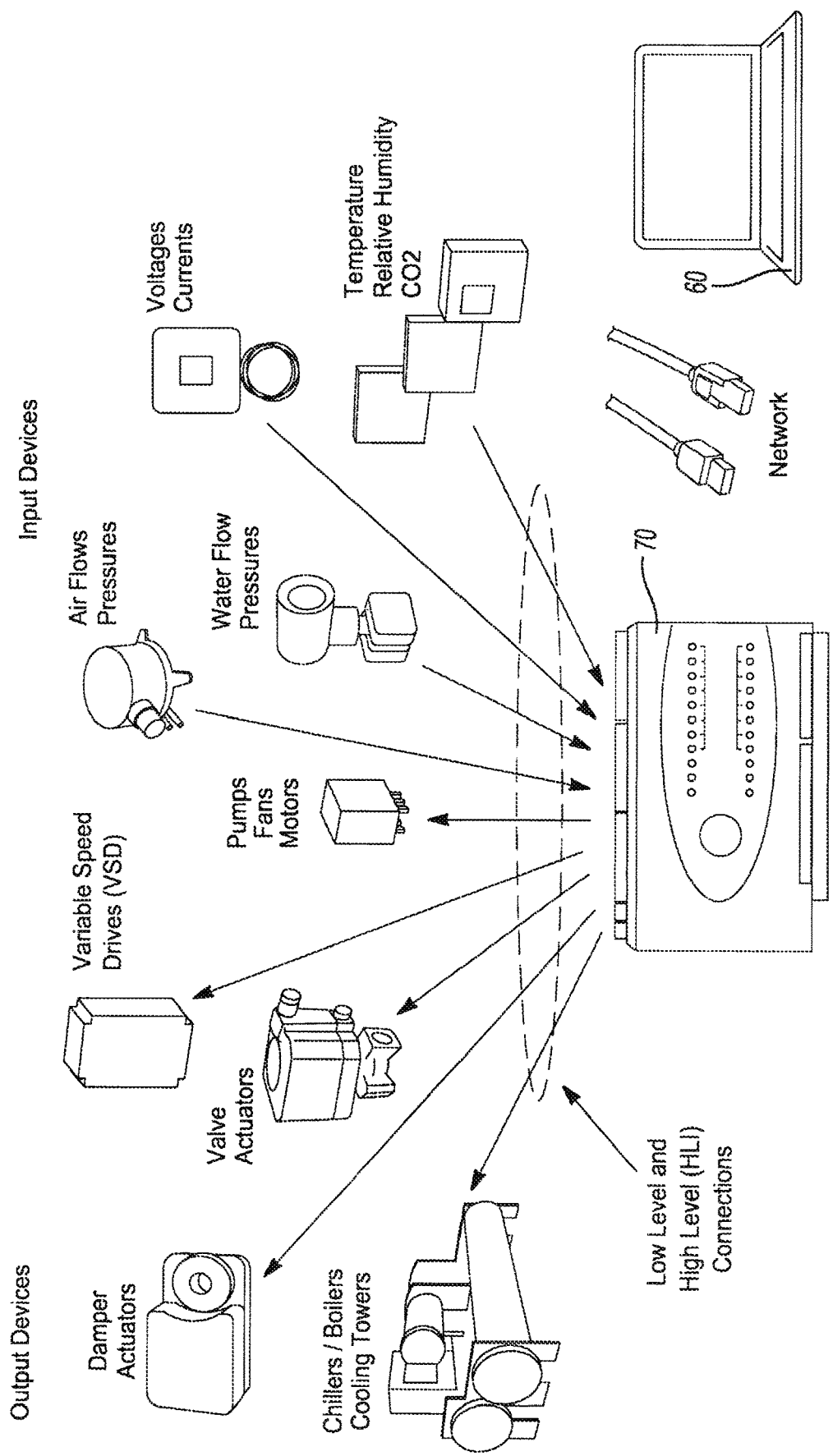
FIG. 19, illustrates an additional application scenario for deploying the optimization control system.

FIG. 19 illustrates how the optimization control strategy can be implemented using a standalone controller 70 which monitors and controls sensors and devices and which communicates with computer 60 over a suitable network. The standalone controller can be provided with input/output ports to communicate using both low level and high level connections, as illustrated.

Figure 20:
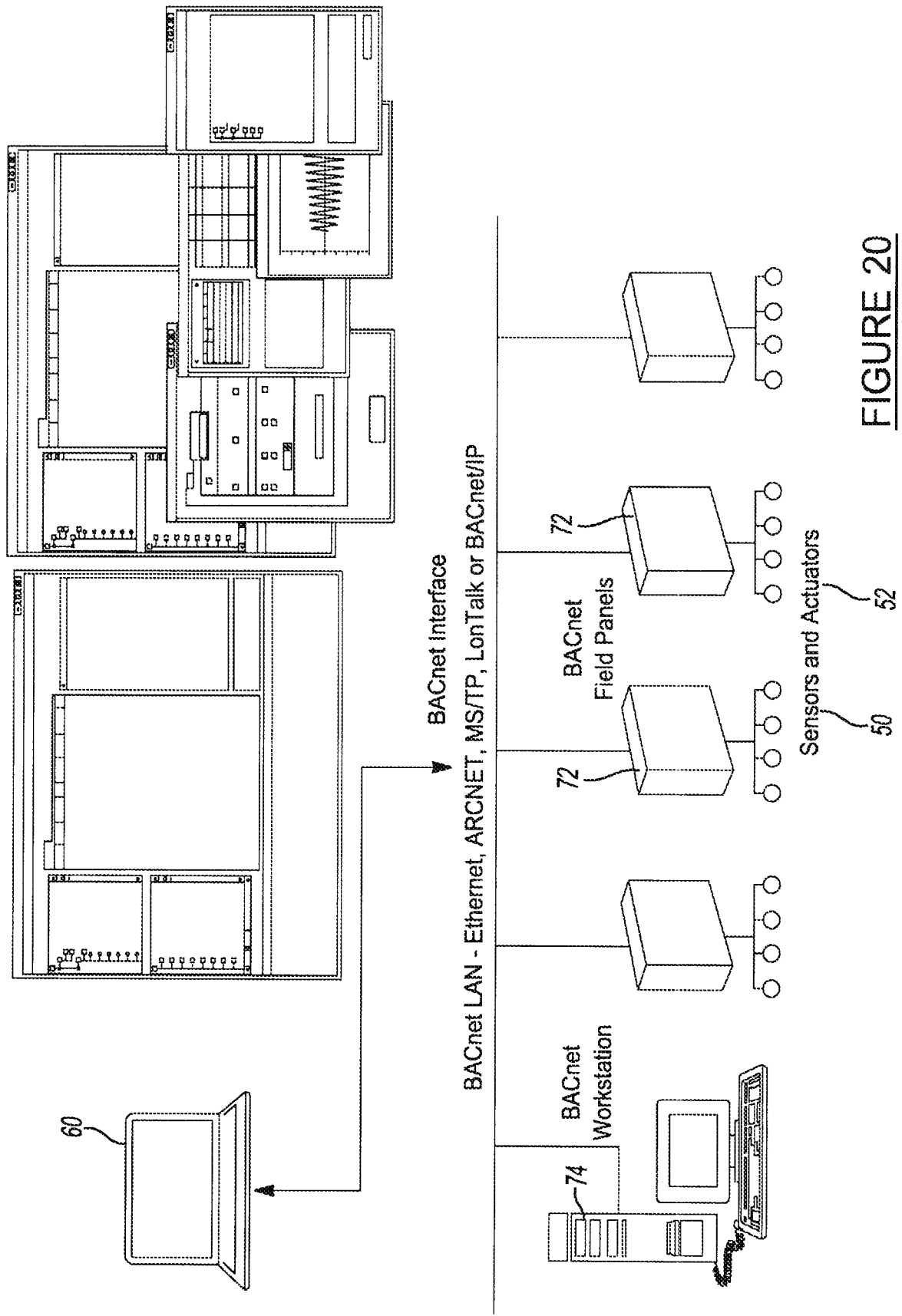
FIG. 20 illustrates how the optimization control system can be integrated into a BACnet interface.

FIG. 20 shows in greater detail how the computer 60 can communicate over a BACnet interface, where the individual sensors and actuators are wired to sets of BACnet field panels 72 and a BACnet workstation 74 serves as the communications computer 130 (FIG. 1, FIG. 3).

Experiments and Analysis

Figure 21:
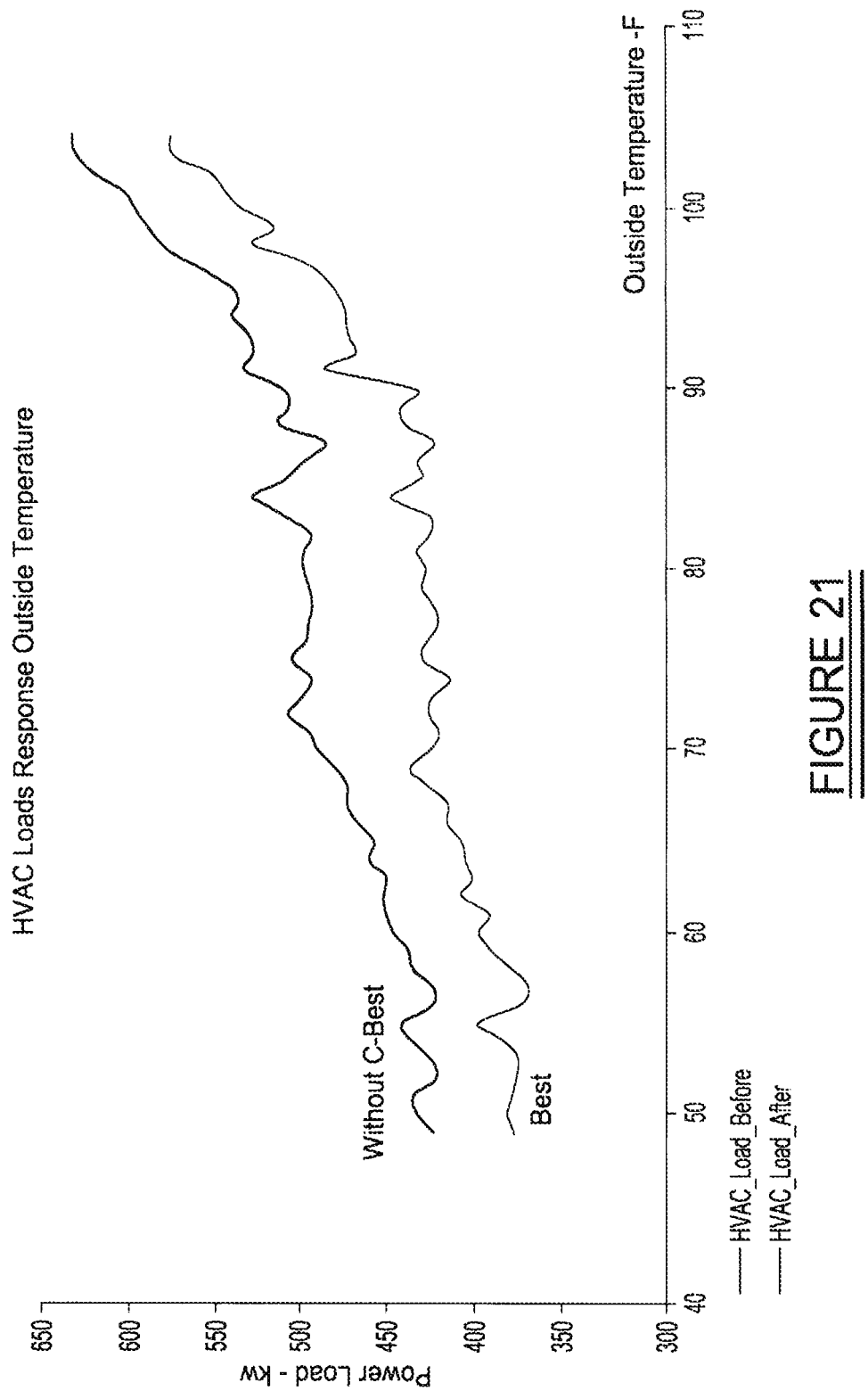
FIG. 21 is a pair of graphs of power load (in kilowatts) vs outside temperature, illustrating how the optimization control system achieves a more efficient operation over all temperature ranges.

To illustrate the benefits of the optimization control system, an exemplary structure has been tested. The exemplary test structure is a typical high-performance computing mixed office load building. The HVAC system of the test structure applies VAV (variable-air-volume) system control with variable speed fan supply air control, liquid cooling for computers, and closed water cycle cooling with chiller and closed outside cooling tower. The highest load of the test structure is about 2.7 MW. The artificial intelligence control system (AICS) gets in 1.2 G+ data including the test structure's 969 Parameters of HVAC system and power line in 5 minutes time step (year one), winter season (year two) and summer season (year two). AICS analyzes so far at least 4 inefficiency control measures and may optimize these energies saving control measures:

Static air pressor optimal set
Exhaust and outdoor Air Damper Faults and Control
Dual-Air fan un-balance operation
Inefficiency variable frequency air supply fan operation The exemplary test structure was designed to emulate a high-performance computing and office mix environment. The disclosed optimization control system was used to find inefficiency control measures and reduce supply air system up to 20% and HVAC system 12% energy consumption (See FIG. 21) using only the following four (4) applied optimized control measures.

Static Air Pressure Optimal Set

Figure 22:
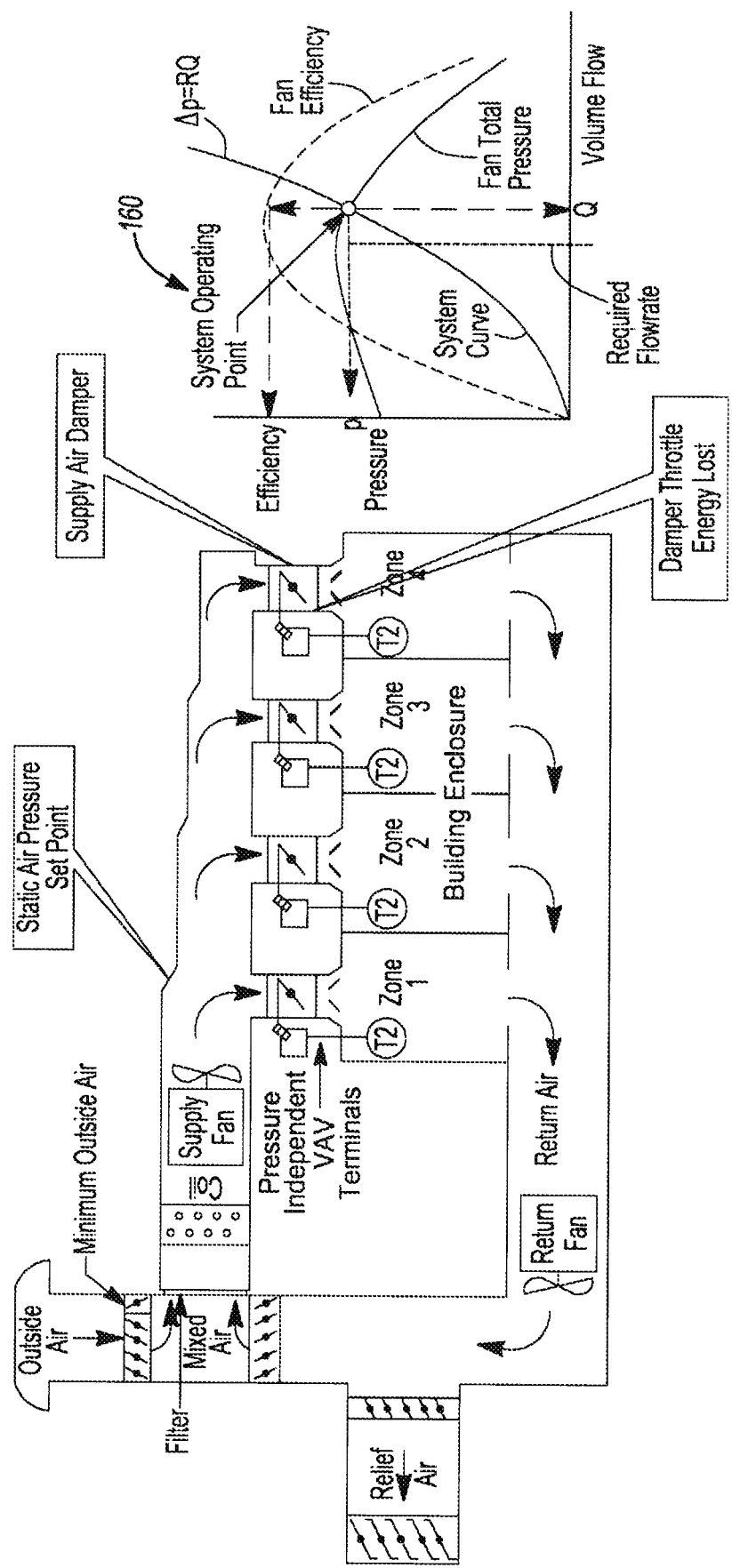
FIG. 22 is a block diagram and accompanying graph illustrating how the optimization control system can optimize the static air pressure setpoint to save damper throttle energy lost.

FIG. 22 illustrates how the static air pressure set point is established. As shown in the graph at 160, the system operating point is located where the fan total pressure curve intersects with the system curve. Note that efficiency at this set point is near the maximum fan efficiency.

Figure 23:
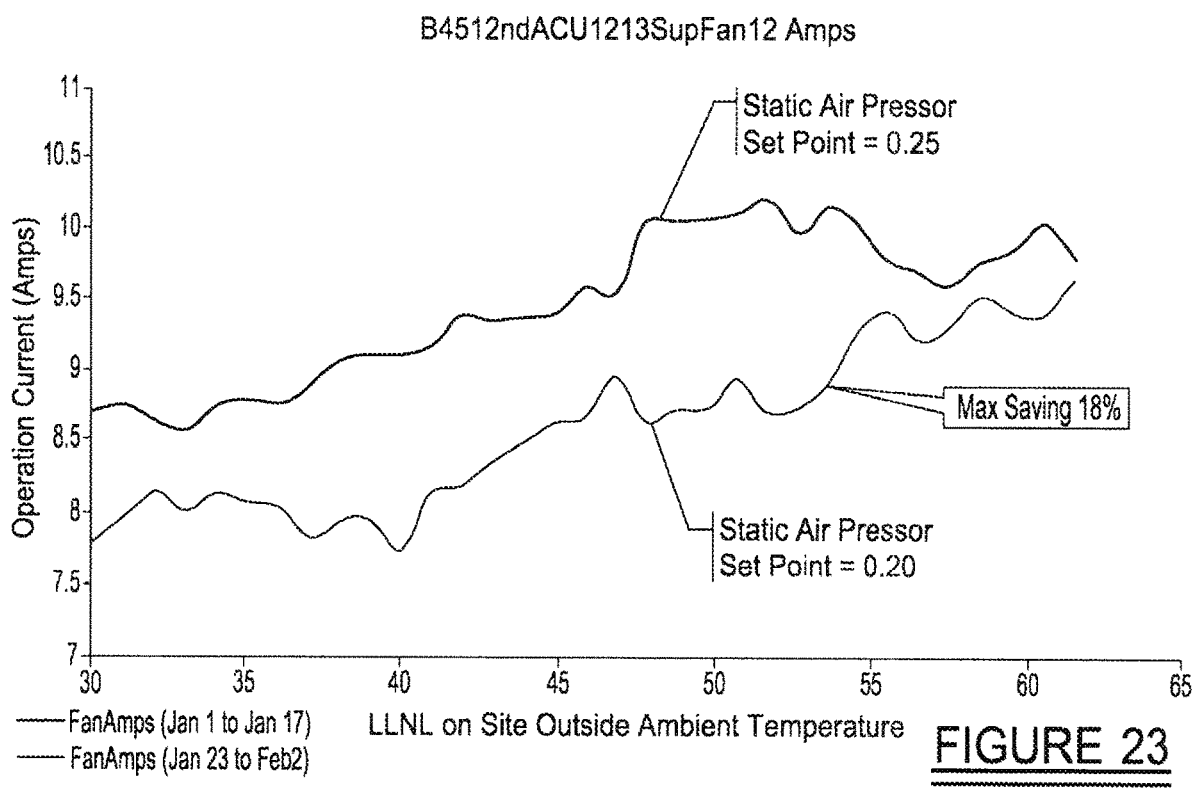
FIG. 23 is a pair of graphs of operation current (in Amps) vs outside ambient temperature, illustrating how the optimization control system achieves a more efficient operation over all temperature ranges.

In the experiment, the AICS system calculated and recommended to regulate static air pressure set point from 0.25 to 0.20. The experiment produced three-month's of data. The experimental test of the AICS system shows that the test structure supply fans' electricity consumption could be reduced by about 5%-10%, by reducing Static Air Pressure Set Point and setting all supply dampers almost fully open in the highest load. FIG. 23 showing experimental data results shows that the supply air fan setting based on the AICS recommendation could produce average energy and maximum energy savings. The AICS system analyzes operation data of the test structure automatically. Most of supply air damper positions are between 30%-60%, VFD air supply fans run at 100% speed most of time. The results show there is a potential energy saving for the test structure. The AICS recommends reducing the test structure static air pressure set point. Based on the static pressure set point of the test structure control logic, the AICS establishes the test schedule for performing an optimized energy efficiency method. Using the AICS-established schedule, the supply static pressure set point was reduced, step by step, to make the most of the air supply damper. In this way an area or office operation position between 90%-100% was achieved, to reduce air pressure energy loss at these dampers. By monitoring the speed of each VFD fan, the VFD air supply fans will work under 100% load and regulate to the suitable values to match the static pressure set point.

Exhaust and Outdoor Air Damper Faults and Control

The AICS also found that the test structure's exhaust damper was working inefficiently. This controlled exhaust damper should follow the outside temperature, tracking the outside air damper; however the AICS discovered that the exhaust damper remains 100% open 90% of the time, requiring controlling of the static air pressure in all seasons, resulting in lots of lost energy. FIGS. 9 and 10 show the damper operation status response outside temperature in June (summer season). The damper remains open even though the outside temperature is more than 105 degrees. The test structure has an economizer which allows the unit to use outdoor air for cooling, provided the ambient air is below a certain temperature and the humidity is below a certain percentage. This type of cooling is often referred to as "free cooling". The longer outside air can be used for cooling, the longer the compressor can remain off. Another benefit is the economizer can extend the life of the equipment—provided the system is maintained properly.

The test structure uses fixed temperature control, with a set point of 65 degrees. In an exemplary California climate zone, the DOE manual recommends using dual-temperature control could be better than fixed control.

The economizer's minimum position is set to 20% all times instead of being controlled by air quality. A computer server room does not need so much fresh air all the time. Thus the 20% minimum open position waste lots of energy in the summer season and for computer server rooms. The AICS recommends checking the economizer's operation status, and then optimizes the dual-temperature control method and improves air quality by sensors to use more "free energy". The additional saving is estimated at 12%.

Dual-Air Fan Un-Balance Operation

Figure 24:
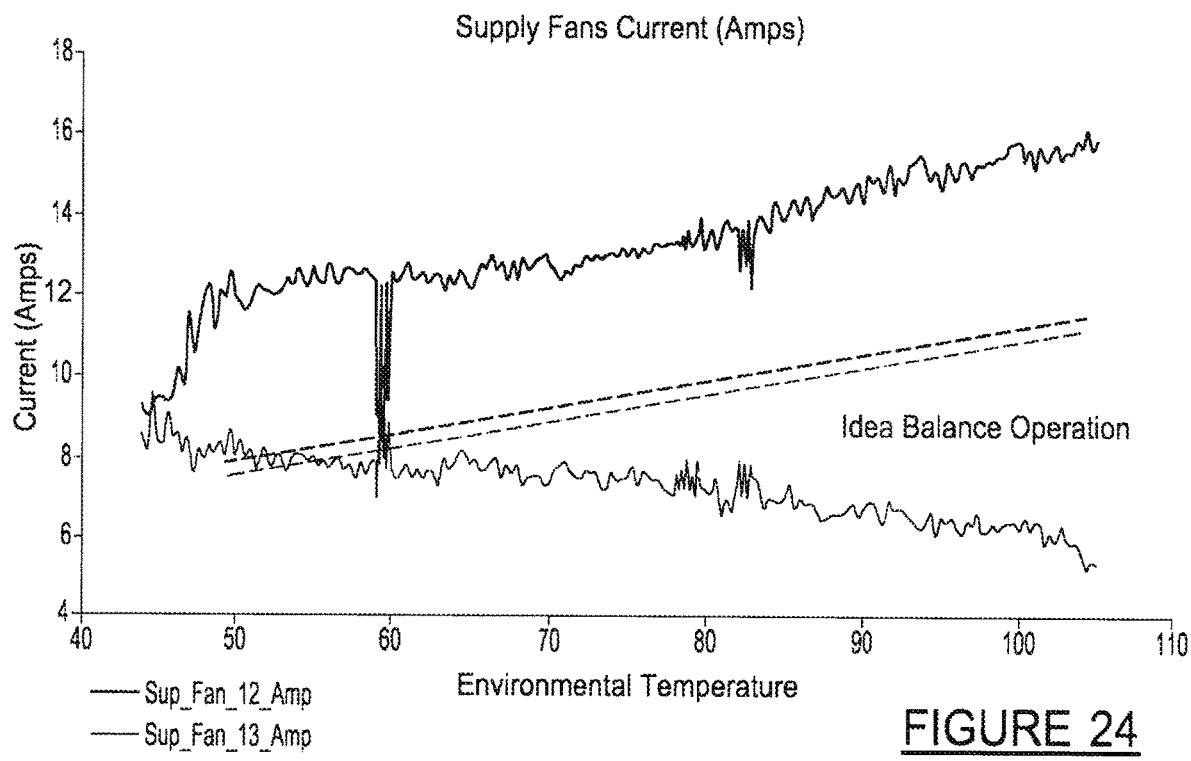
FIG. 24 is a series of graphs of current (in Amps) vs environment temperature, illustrating optimization of a dual-air fan balance operation, both with and without the optimization control system.

The AICS determines the electric current draw of the test structure's two supply fans and finds them to be unbalanced. FIG. 24 shows the determined current unbalance to be almost 3 times (one fan draws three times the current of the other fan). The one supply fan's running current is 16 amps and the other supply fan's running current is 5 amps, when the outside temperature is 105 degrees. The unbalanced running status of air running supply fans raises air energy loss by 3%. The AICS recommends checking the control logic or sensors in order to balance the two fan's working status; alternatively the AICS recommends selecting only one fan running in low load if can could satisfy system's request alone. In this case, the two fan's lowest current draw is 18 amps, suggesting that one fan alone could satisfy the lowest load request much of the time.

Inefficiency Variable Frequency Air Supply Fan Operation

Figure 25:
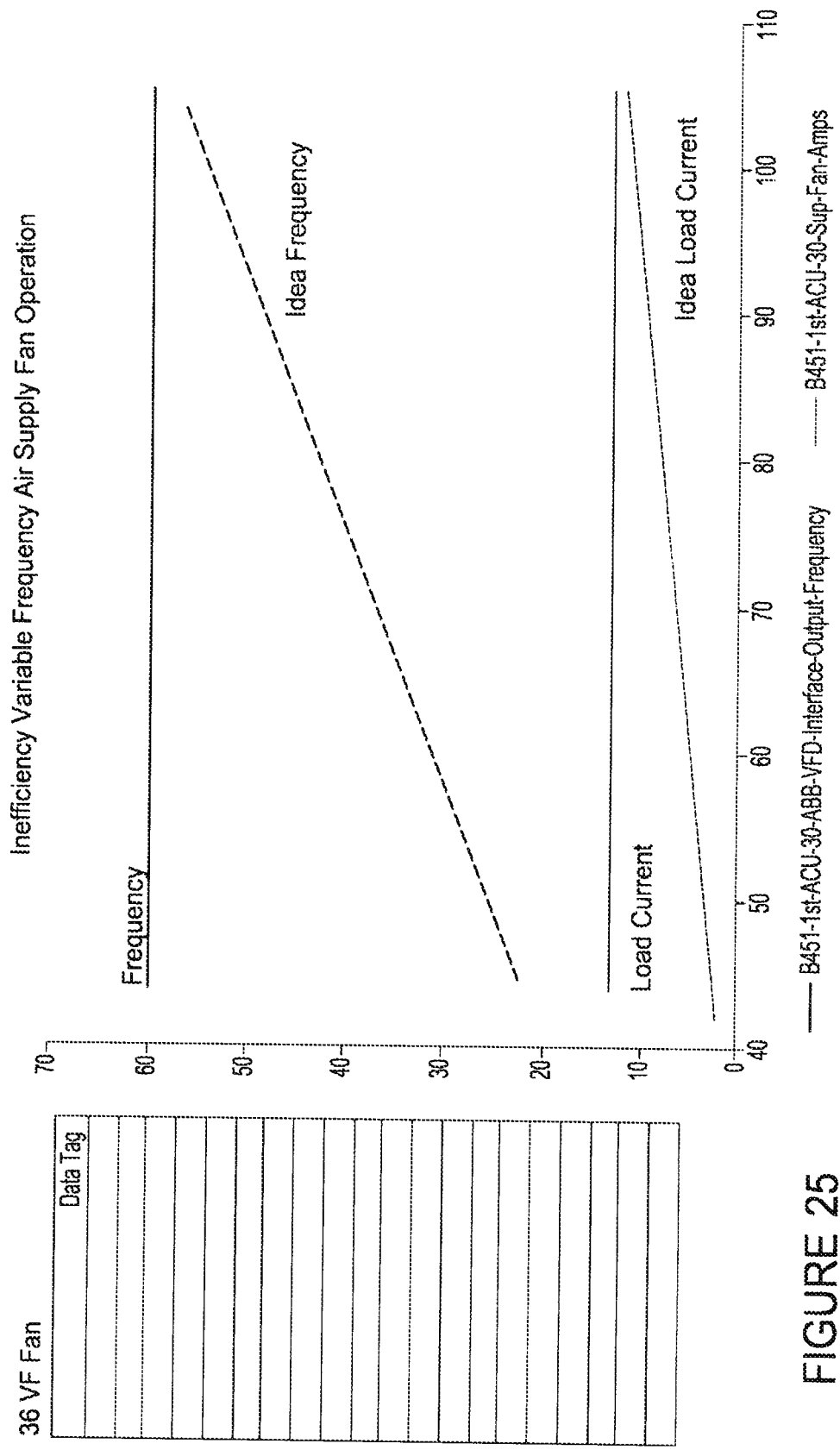
FIG. 25 is a series of graphs illustrating how to optimize a variable frequency air supply fan operation, both with and without the optimization control system.

As shown in FIG. 25, AICS finds the set of variable frequency air supply fans' working frequency status to be always 100% and fans' frequencies do not follow building load. This control measure is inefficient and wasteful of the investment in variable frequency fans. For an example, FIG. 25 shows the variable frequency air supply fan's frequency to always be 60 (100% load) and the load current remains a constant 13 amps in June of Year Two. AICS recommend checking the control logic of those variable frequency air supply fans and making the frequency follow the load.

Conclusions and Modifications Possible

Our research applies AICS—artificial intelligence control system to find inefficiency control measures of high performance computing facility automatically (commercial building) and apply trained high energy efficiency control measures. Experiments of real building (not simulation) have approved our study is effective and significant.

AICS focuses on improving system fault diagnosis and energy efficiency control instead of expensive retrofits. The cost and payback period of AICS is financially attractive than building envelope or HVAC equipment retrofits. In our cases, B451 has enough sensors and parameters to support our research and some buildings might need to install additional sensors. Our research also shows optimizing operations of individual components and optimizing whole-building operations can result in additional savings.

Although AICS has been trained 30+ high energy efficiency advance control measures, we apply only one measure so far and we can potentially apply all optimal control measure of High—performance computing facility.

Base on AICS, further experiments should apply bigger potential energy saving measures on the test structure or other commercial building:

Optimal start-stop;

Supply air temperature optimal set;

Shortened HVAC schedules;

Liquid cooling system of HPC equipment;

Reduced minimum VAV box terminal damper flow settings;

Demand control ventilation;

Wider dead bands and night setback; and

Demand Response Duty Cycle.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A control system for controlling environmental conditions within a structure having at least one environmental control device, comprising: a simulation process implemented by at least one of a computer or a processor, for carrying out a computerized simulation process, to generate and store a simulation model based on conditions associated with the structure and to provide simulation results as data;
 a neural network model, implemented using at least one of the computer or the processor, programmed to implement a neural network, the neural network having an input layer coupled to receive sensor data from the structure and having an output layer coupled to supply control signals to the at least one environmental control device, the neural network model trains the neural network using the simulation model;
 an optimization computer running a particle swarm optimization algorithm to receive the simulation results and perform particle swarm optimization to ascertain a control parameter regime for controlling the at least one environmental control device and supplying said control parameter regime to the neural network model;
 the neural network model being further programmed to use the control parameter regime supplied by the particle swarm optimization algorithm to further train the neural network; and
 wherein the neural network model is trained using:
 static conditions indicating how the structure responds to thermal conditions, and
 dynamic, time-varying conditions to predict different responsive behaviors under the dynamic, time-varying conditions, and where the different, responsive behaviors are used to predict energy consumption levels under the dynamic, time-varying conditions.

2. The control system of claim 1 wherein the simulation process, implemented by the at least one of the computer or the processor, implements a compound simulation model comprising:
 a thermal load model, a structure envelope model, a heating, ventilation and air conditioning (HVAC) model and an occupants model.

3. The control system of claim 1 wherein the neural network model implements a recurrent neural network to predict individual output control parameters.

4. The control system of claim 1 wherein the neural network model implements a convolutional neural network to learn overall shape of at least one performance curve of the structure.

5. The control system of claim 1 wherein the neural network model is trained using the simulation model to which time-varying conditions have been applied to generate dynamic information.

6. The control system of claim 1 wherein at least two of the simulation process, neural network model and particle swarm optimization algorithm are both implemented using the at least one of the processor or the computer, according to different programmatic instructions.

7. The control system of claim 1 wherein the particle swarm optimization operates on parameters associated with heating, ventilation and air conditional (HVAC) equipment disposed at said structure.

8. The control system of claim 1 further comprising a software agent forming a deep reinforcement learning process that responds to an environment associated with the structure and functions to train the neural network model so that the neural network training is updated to account for changes in the environment.

9. A control system for controlling environmental conditions within a structure having at least one environmental control device, comprising:
 a simulation process, implemented on at least one of a processor or computer, for carrying out a computerized simulation process, to generate and store a simulation model based on conditions associated with the structure and to provide simulation results as data;
 a neural network model, implemented by at least one of the processor or the computer, and programmed to implement a neural network, the neural network having an input layer coupled to receive sensor data from the structure and having an output layer coupled to supply control signals to the at least one environmental control device, the neural network model being further programmed to train the neural network using the simulation model;
 an optimization computer running a particle swarm optimization algorithm to receive the simulation results and perform particle swarm optimization to ascertain a control parameter regime for controlling the at least one environmental control device and supplying said control parameter regime to the neural network model; and
 a software agent forming a deep reinforcement learning process that responds to an environment associated with the structure and functions to train the neural network model so that the neural network training is updated to account for changes in the environment
 the neural network model being further programmed to use the control parameter regime supplied by the particle swarm optimization algorithm to further train the neural network using at least one of;
 static conditions indicating how the structure responds to thermal conditions, and
 dynamic, time-varying conditions to predict different responsive behaviors that influence energy consumption levels;
 wherein the neural network drives a plurality of settings of coupled heating, ventilation and air conditional (HVAC) equipment,
 wherein the neural network model implements a convolutional neural network to learn overall shape of at least one performance curve of the structure.

* * * * *